(12) United States Patent
Glukhoy et al.

(10) Patent No.: US 8,062,470 B2
(45) Date of Patent: Nov. 22, 2011

(54) METHOD AND APPARATUS FOR APPLICATION OF THIN COATINGS FROM PLASMA ONTO INNER SURFACES OF HOLLOW CONTAINERS

(76) Inventors: Yuri Glukhoy, San Francisco, CA (US); Tatiana Kerzhner, San Francisco, CA (US); Anna Ryaboy, San Francisco, CA (US)

( * ) Notice: Subject to any disclaimer, the term of this patent is extended or adjusted under 35 U.S.C. 154(b) by 826 days.

(21) Appl. No.: 12/152,064

(22) Filed: May 12, 2008

(65) Prior Publication Data

US 2009/0280268 A1 Nov. 12, 2009

(51) Int. Cl.
*C23C 16/00* (2006.01)
*H01L 21/306* (2006.01)

(52) U.S. Cl. .................. 156/345.2; 118/718; 118/723 I; 118/723 AN; 156/345.48

(58) Field of Classification Search .................. 118/718, 118/723 R, 723 I, 723 IR, 723 AN; 156/345.2, 156/345.48, 345.49
See application file for complete search history.

(56) References Cited

U.S. PATENT DOCUMENTS

| | | | |
|---|---|---|---|
| 966,204 A | 8/1910 | Hewitt | |
| 5,378,510 A | 1/1995 | Thomas et al. | |
| 5,521,351 A | 5/1996 | Mahoney | |
| 6,180,191 B1 | 1/2001 | Felts | |
| 6,276,296 B1 * | 8/2001 | Plester | 118/723 R |
| 6,548,123 B1 | 4/2003 | Plester et al. | |
| 6,599,569 B1 | 7/2003 | Humele et al. | |
| 7,166,336 B1 * | 1/2007 | Mori et al. | 427/577 |
| 2002/0176947 A1 * | 11/2002 | Darras et al. | 427/569 |
| 2003/0150858 A1 * | 8/2003 | Outreman et al. | 220/62.11 |

FOREIGN PATENT DOCUMENTS

| | | |
|---|---|---|
| DE | 3908418 | 9/1990 |
| GB | 1098693 | 2/1968 |

OTHER PUBLICATIONS

R. B. Piejack, V. A. Godyak, and B. M. Alexandrovich in the article entitled "A simple analysis of an inductive RF discharge," Plasma Sources Sci. Technol. 1, 1992, pp. 179 to 186.
R. B. Piejack, V. A. Godyak, and B. M. Alexandrovich "Electrical and Light Characteristics of RF-Inductive Fluorescent Lamps," Journal of the Illuminating Engineering Society, Winter 1994, pp. 40 to 44.

* cited by examiner

*Primary Examiner* — Luz L. Alejandro

(57) ABSTRACT

A method and an apparatus are proposed for simultaneously coating the inner walls of a plurality of hollow containers, such as bottles, with fluid-impermeable barrier layers applied by a PECVD method with the use of transversal antennas capable of creating plasma having density increased in the vicinity of the inner walls of the containers. The barrier-layer application period is divided into a coating period and a noncoating cooling period, with RF energy constantly maintained under working conditions with shunting thereof from the coating station to the dummy loads during noncoating periods used for cooling the plastic containers. The apparatus comprises a vacuum chamber with a conveyor that transports the containers in a preoriented state for interaction with a plurality of aligning elements that can be inserted into the container openings for subsequent fixation at equal distances in positions aligned with the antennas that can be inserted into the containers for generation of the coating-applying plasma.

10 Claims, 19 Drawing Sheets

METHOD AND APPARATUS FOR APPLICATION OF THIN COATINGS FROM PLASMA ONTO INNER SURFACES OF HOLLOW CONTAINERS

FIELD OF THE INVENTION

The present invention relates generally to plasma processing and in particular to means and apparatus for plasma-enhanced chemical vapor deposition (PECVD) of thin films, especially onto the interior surface of hollow containers such as bottles, containers, pipes, etc., as well as for combined cleaning, barrier coating, and sterilizing of food containers or pharmaceutical packaging materials.

BACKGROUND OF THE INVENTION AND DESCRIPTION OF THE PRIOR ART

Although glass containers are substantially impenetrable and provide products with long shelf life, they are heavy and expensive for manufacturing and transportation. Containers made of polymeric materials now replace glass containers in applications where traditionally glass containers were used. Plastic containers are less susceptible to breakage, less expensive to manufacture, and lighter and less expensive to ship. Used for packaging are plastic materials such as polyethylene terephthalate (PET) and high-density polyethylene (HDPE) in the form of bottles or other shapes having an opening at the top.

PET containers are used for liquids such as wine, soft drinks, etc. HDPE is used for packaging milk, water, juice, cosmetics, shampoo, etc. HDPE containers are more available for recycling than PET containers and serve a second life for the packaging of liquid laundry detergents, shampoo, conditioner, motor oil, etc.

However, glass properties such as chemical resistance and permeability are not attainable for plastics. Polymer-chain clearance of a plastic structure is less than 1 nm and, hence, cannot prevent penetration of low-molecular gases having molecules ranging in size from 0.3 to 0.4 nm. The walls of such packages are permeable in both directions in relation to gases such as oxygen, carbon dioxide, etc. The shelf life of liquids is limited, especially for soft drinks and other $CO_2$-containing liquids. A long shelf life is required for carbonated beverages (soft drinks and beer), fruit juice, cosmetics, chemicals, and pharmaceuticals. Deterioration of liquids on the shelf, especially in hot weather, is caused by several factors: (1) oxygen, which is responsible for entering the container through the plastic wall from outside; (2) carbon dioxide, which escapes through the same container wall; and (3) low chemical resistance of a PET container to strong contents such as a carbonated soft drink or alcoholic beverages. Molecules of liquid absorbed at high temperature in hot weather or during microwave heating are combined with hydroxyl, thus grouping the polymer matrix and weakening the existing hydrogen bounds between the polymer molecules. As a result, interchange distances increase and create free volume, which facilitates the diffusion of oxygen and perhaps the diffusion of other gases as well. If a PET package contains a flavor compound (such as orange juice or apple juice), this compound causes swelling of the PET container, i.e., opening the structure and further increasing the specific free volume that leads to oxygen transport. Therefore, flavor absorption significantly increases oxygen permeability of PET.

One can expect a reduction in shelf life of oxygen-sensitive products because of higher oxygen permeability. At 23° C., 50% relative humidity (RH), and atmospheric pressure (oxygen at 0.21 atmosphere) outside a bottle, a 0.5-liter nominal-volume bottle formed from PET has an oxygen transmission rate of 0.126 cc/bottle/day. Under the same conditions, the same bottle formed from HDPE has an oxygen transmission rate of 8.47 cc/bottle/day. Flavoring ingredients of low-molecular organic compounds existing in drinks such as lemonade absorb the plastic material and thus deteriorate the quality of the drink. For these reasons, plastic containers are unsuitable for drinks, especially those with carbon dioxide, alcohol, and flavoring ingredients.

In order to prolong the shelf life of these liquid products, a better gas barrier is required. The barrier property of plastic containers can be improved by coating the inner walls of these containers with a transparent layer, e.g., quartz-like $SiO_2$. The aforementioned barrier layer should remain after hot filling or pasteurization. Besides reducing the permeability of the containers, the layer that absorbs UV irradiation, which causes deterioration in the taste of wines and other beverages, is also included in this barrier. Such coating is provided by means of plasma-enhanced chemical gas-phase deposition (PECVD) of an organosilicon compound having an excess of oxygen.

The PECVD process is described, e.g., by J. Felts in U.S. Pat. No. 6,180,191 issued in 2001. A PECVD-applied silicon dioxide ($SiO_2$) layer on the inside surface of a PET bottle prevents the ingress of oxygen and the egress of carbon dioxide that would affect the taste of the product and its shelf life. After deposition of a thin silicon oxide coating, the oxygen transmission rate is reduced to 0.076 cc/bottle/day.

The PECVD process first deposits a transparent adhesive layer of nanocrystalline SiO and then a colorless silicon oxide ($SiO_x$) barrier layer having a thickness of 0.01 to 0.1 micron. The $SiO_x$ layer improves the oxygen-barrier properties of a bottle more than 10 times, and the $SiO_2$ barrier, specifically, improves this property more than seven times. These barrier improvements remain after hot filling or pasteurization. In addition to the use of PECVD in the food and pharmaceutical industries, application of a PECVD barrier onto the inner surfaces of hollow objects may be used in automotive and piping industries wherein plastic materials such as HDPE are used to replace metals because of their excellent tensile strength and impact properties at temperatures as low as −50° C. and at temperatures as high as 70° C., which match the temperature range in fuel tanks and pipe lines. Since HDPE is low in weight and cost, it is competitive with steel. However, HDPE has one drawback, and this is permeation of fuels. In order to overcome this drawback, it is necessary to develop an improved barrier coating suitable for application onto the inner surfaces of HDPE tanks and pipes, especially those designed to contain gasoline, alcohol, or other toxic, corrosive, and health-hazardous materials. Moreover, the same coating system is supposed to serve as an inductive probe to provide quality control of the thickness, uniformity, and integrity of the barrier in the inner surface of the wall after the deposition process. The $SiO_2$ coating has high optical transparency and a markedly improved barrier effect as well as greater tensile strength. Silicon dioxide is nontoxic and does not affect the recycling of PET and HDPE.

The inner container coating of $SiO_2$ provides an excellent gas permeation barrier because of two important properties. First, the coating on the interior surface of the container is not subject to abrasion during shipment and handling when compared to the exterior surface of the container. Second, by forming the coating on the interior surface of the container, degradation of the product within the container from direct interactions between the product and the container is prevented.

Thus, there is a demand for a simple, inexpensive, and reliable process for application of barrier coatings onto the inner walls of polymeric containers. The process should have a fast cycle time to accommodate production demands and be suitable for integration into a bottle-molding production line, such as a Husky molding system with throughput of 15,500 bottles per hour. Further, the barrier coating should have good uniformity, and the barrier-coated polymeric container should be easy to recycle.

A plasma-enhanced chemical vapor deposition (PECVD) coating from a gaseous phase is well known and is used in the semiconductor industry to treat semiconductor wafers. However, a flat substrate such as a semiconductor wafer, which is an object of deposition, can be treated at high temperatures with application of a bias voltage, while in the case of plastic containers, the material of such containers has a low melting point that cannot withstand high temperatures. Plasma discharge is developed by an RF antenna introduced into the container together with a gas mixture and when the RF antenna is energized, this causes a plasma-chemical reaction that results in generation of silicon dioxide, which is deposited onto the inner walls of the containers in the form of a thin barrier layer of $SiO_2$. The plasma-chemical reaction can be conducted between different silicon-containing gases such as silane or disilane and oxygen-containing gases such as nitrogen dioxide, nitrous oxide, etc. Because of the flammability and explosiveness of silanes, the above process requires special, expensive facilities in the semiconductor industry. The food industry prefers to conduct the processes under less expensive, unpretentious conditions with a safer organosilicon or siloxane and by conducting the plasma chemical-reaction with pure oxygen. The plasma-chemical reaction may also have safe-reaction byproducts, such as $CO_2$ and water. Plasma discharge inside a container decomposes siloxane vapor and breaks off methyl groups. Further, the oxygen oxidizes the condensable siloxane backbone (Si—O—Si) resulting from the organosilicon decomposition, thereby forming a plasma-enhanced chemical vapor deposition (PECVD) thin film of silicon oxide ($SiO_x$) on the interior surface of the container. Gaseous organosilicon is received, for example, from liquid tetraethylorthosilicate (TEOS). TEOS can be converted into vapor by using a direct liquid injection subsystem DL125-C (a product of MKS Company) that includes a vaporizer that evaporates the liquid into vapor for introducing it into the processing system. Byproducts ($CO_2$ and water) are removed by means of a vacuum system through small holes provided in a bottle holder.

The pure $SiO_2$ barrier, however, presents some disadvantages because it is brittle and can be torn during bending and squeezing. In order to enhance durability of the coating, a double-layer coating is preferred wherein the first thin layer is a layer of nanocrystalline $SiO_2$ deposited on the plastic wall. This first layer blocks the porosity of plastic and simultaneously improves the adhesion to plastic of the next thick layer of amorphous $SiO_2$ intended for contact with the liquid. This layer increases chemical resistance of the wall to aggressive species and simultaneously reinforces the barrier layer to prevent rupture of the film.

The methods and devices for generation of plasma used to form barrier coatings inside plastic containers are adopted from the sterilization processes inside the bottles described in the British Patent GB 1,098,693 (Menashi, et al., issued in 1968). Menashi describes a device for sterilization inner surfaces of plastic bottles by a method in which a central electrode is introduced into a bottle that is surrounded by an external electrode. Two electrodes form a coaxial system connected to a high-frequency current source. Argon (Ar), as a process gas with low potential of ionization, is introduced into the bottle through a hole in the central electrode in order to develop a capacitively coupled plasma (CCP) discharge. The device described in this patent is characterized by a high electric field, of the order of 450 V/cm, and a very weak current, of the order of a few milliamps at high RF power. The low current of the CCP discharge is caused by losses of RF power sustaining the discharge because 70% of this power is wasted by bias-current heating of the inner and outer electrodes, as well as the plastic between the electrodes. The CCP discharge is divided by the plastic wall on the useful discharge inside the bottle, the discharge providing deposition and parasite discharge between the outer electrode and the outer wall of the bottle. The parasite discharge consumes a valuable part of RF power. Only a small part of RF power sustains the inner discharge used for sterilization. The treatment time of sterilization is too long for application of this process in industry. Another disadvantage of such a method is sputtering of the electrodes in the CCP discharge by high-energy ions of argon and contamination of the inner surface of the container by material of the inner electrode.

In spite of such disadvantages, Thomas, et al (see U.S. Pat. No. 5,378,510 for "Methods and apparatus for depositing barrier coatings" issued in 1995) adopted the above-described geometry because of its simplicity. The authors of the above invention proposed to use the RF discharge to decompose process gas delivered through a gas inlet referred to as "adjacent axis conduit extending into hollow container. Decomposition of the process gas forms organosilicon vapor, which is deposited in the form of a barrier layer of SiOx onto the inner surface of the bottle, called 'a hollow polymeric container'. RF power was applied to the outer electrode, called "an electrically conductive shell surrounding hollow container."

U.S. Pat. No. 7,166,336 issued in 2000 to Mori, et al, and U.S. Pat. No. 6,180,191 issued in 2001 to Felts disclose the use of the same coaxial deposition system individually for each bottle with some differences in bottle evacuation procedures. The Felts process occurs in a vacuum chamber wherein the outer electrode is located adjacent to an exterior surface of the chamber, but Mori combines the coaxial deposition system with the vacuum chamber, while the outer electrode serves as a wall of the vacuum chamber that is individual for each bottle. The gas inlet in both systems is the same as proposed by Thomas, but the supply of gas is carried out through a plurality of small holes. The structure includes an immersed, grounded central electrode of the coaxial system and supplies the PECVD process with a gaseous precursor.

RF power is applied to an outer electrode located adjacent to an exterior surface of the chamber and to the inner electrode combined with the gas inlet. In "inverse" radial flow reactors, the gas inlet is at the center of the lower electrode, with the gas flow directed radially outward. The PECVD thin film, after decomposition, deposits onto the interior surface of the container. In the Thomas case, the bottle is rotated to enhance uniformity of the barrier layer. In the Felts case, the inner electrode is rotated by a magnetic drive in order to randomize the substrate position that faces the gas stream and to optimize uniformity of deposition. However, Mori, who reduced the clearance between the outer electrode and the outer wall of the container in order to reduce parasitic discharge from the bottle, has divided the outer electrode, which tightly envelops the container, into three parts: (1) a bottom portion of the electrode that is disposed along the bottom of the plastic container; (2) a body portion of the electrode that is disposed along the body of the plastic container; and (3) a shoulder portion that is located above the body portion enveloping the neck of the container. Resistive or capacitive elements are interposed between the outer electrodes to provide distribution of RF power and simultaneously to seal the outer electrode that serves as an individual vacuum chamber. An output terminal of the RF generator is connected only to the first portion of the outer electrode through a matching network. The aforementioned distribution of RF power makes it possible to provide varying plasma density at the bottom, middle, and neck of the container. This design provides uniformity in coating thickness on the inner surfaces of the bottom, body, and neck of the container, which are differently spaced from the inner electrode. Although the devices proposed by Mori, Thomas, and Felts generate coating films of different types (in Mori's case, these are diamond-like films, and in the Thomas and J. Felts cases, these are silicon dioxide films), the devices suffer from the same disadvantages that are inherent in CCP discharge, in general.

The main disadvantage of aforementioned processes and devices is that application of the CCP discharge to coat the inner surfaces of a container is carried out at a low-deposition rate limited by 10 nm/sec, a rate that significantly reduces throughput of a production line. On the other hand, lengthy treatment of plastic materials at high flux of thermal energy generated by electrodes softens the plastic to the extent that after reaching a critical point, a container can collapse. In order to increase the deposition rate, plasma density must be increased (e.g., by increasing pressure inside the container), and also RF power that sustains the discharge must be increased. On one hand, increase in pressure leads to breakdown of the space between electrodes by the arc between both electrodes, which damages the container. On the other hand, high RF power initiates corona discharge on the inner electrode.

Thus, the process of coating using CCP discharge proceeds at a very low rate and prolongs cycle time, which typically ranges from 10 to 15 seconds. Such a low duty cycle is not suitable for mass production of barrier-coated containers and limits throughput to six bottles per second. Furthermore, although high-power RF generators are expensive devices, in the case of CCP discharge they are used with low efficiency. For example, a valuable part of RF power is wasted for heating the outer and inner electrodes and for a parasite discharge in the space between the outer electrode and the outer wall of the container. A lengthy coating process can lead to melting of the containers, taking into account that the walls are heated by plasma. They are heated also from both sides by infrared irradiation emitted from the overheated inner and outer electrodes. Another problem associated with the use of CCP discharge is bias current driven by alternating voltage through the plastic. Such current creates additional heat, which deteriorates and melts the structure of the plastic walls.

Another obstacle is a high surface charge on the outer and inner surfaces of the walls that occurs between outer and inner discharges. UV radiation from plasma initiates photoemission from dielectric material that generates high electrical charge on the surface, and this, in turn, causes microarcs that destroy integrity of the thin film.

Another obstacle is a high-potential charge that remains on the surface of the container after deposition; this charge attracts dust, and therefore the container may require an additional sterilization.

Evacuation of containers at a high rate by means of a vacuum system for a quick drop in pressure is needed to create balance between high pressure inside the container and low pressure outside the container in order to reduce parasitic discharge, tight enveloping of the container for reducing the space between the outer wall of container and outer electrode with subsequent decrease of time needed for loading the containers, heating of both electrodes and plastic between them, and collapsing and charging of the container walls, all of which make the CCP discharge process highly inefficient in the formation of barrier coatings. Provision of the outer electrode makes it impossible to apply the coating onto the inner surfaces of plastic tanks and pipes having a curvilinear shape.

On the other hand, known in the art is ICP discharge, which is used as source of light and has been used as a source of light for some time. An ICP discharge has been described and analyzed in literature, such as in articles by R. B. Piejack, V. A. Godyak, and B. M. Alexandrovich titled "A simple analysis of an inductive RF discharge," Plasma Sources Sci. Technol. 1, 1992, pages 179 to 186, and "Electrical and Light Characteristics of RF-Inductive Fluorescent Lamps," Journal of the Illuminating Engineering Society, Winter 1994, pages 40 to 44. An ICP light source comprises a vacuum vessel, an inductive coupling system immersed in the vessel, and a high-frequency power source. In the initial stage of operation of inductively coupled plasma, an electrical field (E field) ionizes the fill in the gas-filled volume, and the discharge is initially a characteristic of an E discharge. Once breakdown occurs, however, an abrupt and visible transition to the H discharge occurs. Inductively coupled plasma works on the principal of producing an electric field in a body of gas by means of electromagnetic fields induced by oscillating current in the vicinity of the gas.

When the fields induced in the gas are strong enough, the gas can break down and become ionized in order to generate plasma. Such plasma has been used for a number of applications ranging from fluorescent lighting to plasma treatment of semiconductor wafers. During operation of an inductively coupled discharge, both E and H discharge components are present, but the applied H discharge component provides greater (usually much greater) power to the plasma than the applied E discharge component.

The inductively coupled plasma has been created by either wrapping a solenoid coil around a glass or quartz tube containing gas ("helical induction") or by placing such a solenoid or spiral within the volume of gas itself ("immersed induction"). In a typical approach, an RLC circuit created by the inductive coil and a matching circuit are tuned to resonance and develop high currents on the coil. An alternating electromagnetic field induced within the gas volume creates a conductive plasma discharge having characteristics similar to secondary winding of a transformer, with a portion of the current through the discharge being converted to light. Lighting devices using immersed induction are described by Hewitt in U.S. Pat. No. 966,204, issued Aug. 2, 1910. Generation of light requires high plasma density in the center of a vessel so that the flat spirals, or solenoids, are immersed in a vacuum bulb having axial symmetry. However, use of axially symmetric antennas is not applicable to elongated containers, e.g., bottles, since they cannot generate plasma having high and uniform density near the inner walls of containers.

An example for use of capacitively coupled plasma for deposition of a barrier coating layer onto inner surfaces of bottles is disclosed in German Patent DE 3,908,418, by H. Grunwald, issued Sep. 20, 1990. This patent describes a system designed for plasma-assisted film deposition or treatment of hollow containers and comprises a capacitively coupled plasma system to drive a low-pressure gas discharge within the form. Such a system also has disadvantages, including a potentially lower deposition and treatment rate for mass-produced applications. Similar to other capacitively coupled plasma systems, the system of the aforementioned invention uses high plasma sheath energies that may result in excess heating of sensitive plastic container walls resulting in container damage. This design is also complicated and may require expensive and regular maintenance caused by film deposition on power-coupling components.

Also known in the art is the use of apparatus for coating the inner walls of containers, such as bottles, by means of deposition from inductively coupled plasma (see, e.g., U.S. Pat. No. 5,521,351 issued in 1996 to L. Mahoney). This invention relates to inductively coupled plasma generated within the interior of a hollow form held within a vacuum chamber enclosure by using a radio frequency coil mounted within the vacuum chamber around the outer surface of the container and closely conforming to the shape of the hollow container. The interior of a hollow form having complex shapes can be treated using two or more coils arranged to treat distinct portions of the form, and the shape of the coils and the manner in which power is supplied to the coils can be selected to control spatial distribution of the plasma within the hollow form.

A drawback of this system is low throughput because of non-optimal direction of the magnetic field generated by the coil. RF power applied to this coil provides RF current that generates an axial magnetic field. Therefore, plasma density in such a system is distributed so that maximum plasma density is concentrated in the vicinity of the axis but minimum plasma density is close to the inner wall of the container. Thus, coating of the walls in such a system has a low throughput rate.

The disadvantage of all apparatuses and methods for application of coatings onto the inner surfaces of containers known to the inventor is that some of the known methods and apparatuses are not suitable for application of silicone dioxide layers onto the inner surfaces of containers. Other conventional methods and apparatuses are difficult to control and do not allow deposition of thin coatings onto low-melting-point plastics at relatively low temperatures, and, most importantly, all methods and apparatuses known to the inventor have low efficiency and do not provide sufficiently high throughput in mass production. Existing antennas of apparatus for treating inner surfaces of containers have a geometry that does not produce plasma fields that match the inner profiles of containers.

OBJECTS AND SUMMARY OF THE INVENTION

It is an object of the present invention to provide a method and apparatus for application of gas and liquid-proof coatings onto the inner surfaces of hollow containers such as bottles, containers, etc., by using a PECVD process and an antenna capable of generating inductively coupled plasma (ICP). It is a further object to provide a method and apparatus for application of a fluid-impermeable barrier layer of silicon dioxide onto inner surfaces of containers by generating ICP discharge plasma in a PECVD process. It is a further object to provide the aforementioned method and apparatus which are suitable for application of one or more layers of silicone dioxide coatings onto the inner surfaces of hollow containers at relatively low temperatures, with high-speed rate of deposition and with possibility of controlling the coating material deposition process. It is a further object to provide the aforementioned method and apparatus suitable for high throughput under mass production conditions. It is another object to provide the aforementioned apparatus that incorporates a transversal RF ICP antenna having a three-dimensional shape tailored for specific profile of the inner walls of hollow containers such as bottles and capable of sustaining plasma inside the containers with plasma density uniform and increased in the vicinity of the inner walls of the containers. It is a further object to provide the aforementioned method and apparatus suitable for incorporation into a high-speed automated production line for coating and filling the containers with beverages without the need for sterilization, which is eliminated from the production process due to the use of the apparatus and method of the invention. It is a further object to transfer a plurality of containers treated in the apparatus of the invention in the form of an array of containers prealigned in the same positions as the nozzles of the filling machine. It is another object to provide the apparatus of the invention with a mechanism for automatic alignment of the containers delivered by a feeding conveyor into an array of equally spaced containers and with a mechanism for automatic fixation of the containers in the aligned positions. It is another object to provide the aforementioned method and apparatus, which do not generate high temperature during deposition and do not destroy the plastic material of the containers. It is a further object to carry out the aforementioned PECVD process for simultaneous treatment of a plurality of containers without discontinuing the supply of RF power to the coating stations but rather redistributing the power from the coating stations to dummy loads during noncoating periods in the working cycle.

In general, the apparatus of the invention for application of thin coatings from plasma onto the inner surfaces of hollow containers by a PECVD process comprises: a vacuum chamber; a conveyor for transporting a plurality of preoriented hollow containers through the vacuum chamber; an alignment mechanism comprising a plurality of expandable members that can be inserted into hollow containers for shifting the containers to approximately equal distances when the expandable members expand; a fixation mechanism for fixing the hollow containers in the aligned state; an expandable member driving mechanism for inserting the expandable members into the hollow containers prior to expansion and for removing the expandable members in a nonexpanded state from the hollow containers after the hollow containers are aligned and fixed by the alignment and fixation mechanisms in the form of an array of equally spaced hollow containers; a plurality of coating stations, each coating station comprising a transversal antenna, a container evacuation tuber, and a process gas supply tube that can be inserted into the hollow containers; an RF generator connected to the plasma excitation winding; and a mechanism for unloading the coated containers from the vacuum chamber for subsequent treatment in the form of the aforementioned array of equally spaced hollow containers. The apparatus is further provided with a lifting mechanism for delivery of the array of equally spaced hollow containers in an aligned state to the coating stations. The aforementioned expandable members are made from a flexible material and in the noninflated state have diameters smaller than the opening of the containers and in the inflatable state have diameters greater than the diameters of the containers. The fixation mechanism comprises a neck-locking system having an array of variable apertures that are large enough to capture the necks of the containers, which are randomly distributed on the conveyor after spreading out the expandable members and narrowing to the size of the necks, in order to lock the necks during delivery of the containers by the clamping the device to the vacuum chambers. In order to maintain RF power and to sustain plasma in a continuous manner during periods of noncoating when the containers are cooled, the apparatus is provided with dummy loads to which the RF power is redistributed during the aforementioned periods. In the dummy loads, which are sealed vessels filled with inert gas, plasma is maintained in a sustained state. Each RF ICP antenna is a transversal RF ICP antenna comprised of at least two windings, which are connected in series or parallel, azimuthally distributed relative to the axis of the mouth of the hollow container, and energized by the RF current that generates electromagnetic fields normal to the lateral surface of the aforementioned hollow container.

The process according to the invention comprises the following steps: (1) providing an apparatus for application of thin coatings from plasma simultaneously onto the inner surfaces of a plurality of hollow containers by a PECVD process, wherein the apparatus contains a vacuum chamber, a conveyor for transporting a plurality of preoriented hollow containers through the vacuum chamber, an alignment mechanism provided with a plurality of expandable members that can be inserted into the hollow containers, a fixing mechanism for fixing the containers in an aligned state in the form of an array, an expandable-element-driving mechanism, an array of transversal RF antennas capable of generating an ICP (hereinafter referred to as a transversal RF antenna), a lifting mechanism for lifting the array of aligned containers toward the array of antennas, and a mechanism for transfer of the processed containers to the following processing step in the aligned state; (2) loading the containers in a preoriented bottom-down position to the vacuum chamber; (3) positioning the preoriented bottomless containers under the array of expandable members; (4) inserting the expandable members in a nonexpanded state into the container openings with the use of the expandable-element-driving mechanism and expanding the expandable members to diameters greater than diameters of the containers so that the inflated elements apply pressure to the inner walls of the container and act as universal joints for shifting the captured containers to aligned positions; (5) fixing the containers and locking them in positions aligned with the transversal RF antennas by means of a pair of moveable fixing elements that form a plurality of narrowing openings around the containers, e.g., around the bottle necks; (6) deflating the expandable members; (7) extracting the expandable members from the containers with the use of the expandable-element-driving mechanism; (8) lifting the plurality of the aligned containers toward the plurality of the transversal RF antennas for immersing the RF transversal antenna into the hollow container; (9) evacuating air from the containers; (10) filling the container with a process gas that comprises a mixture of gaseous organosilicon and oxygen or oxygen-containing gas; (11) generating an inductive coupled plasma (ICP) discharge inside the containers with the use of the transversal RF antennas, causing a plasma-chemical reaction between the aforementioned gaseous organosilicon and oxygen or oxygen-containing gas, and producing gaseous silicon dioxide that is deposited onto the inner walls of the container, thus forming a thin fluid-impermeable barrier layer on the inner walls of the containers.

In certain aspects, each winding of the transversal antenna is a solenoid faced to the wall of the hollow container, having a rectangular, elliptical, or oval configuration, wrapped on the transversal mandrel with a radius of curvature equal to or less than the radius of curvature of the aforementioned mouth through which such transversal RF antenna is immersed inside the hollow container.

Distance d between neighboring turns of the spiral coil is related with a breakdown voltage $V_B$ as:

$$V_B = A\, pd/\ln(pd) + B,$$

where p is pressure in the volume into which the antenna is immersed, pd is the Paschen minimum, and A and B are constants, depending on geometry of the antenna.

In certain embodiments, input of the first winding and output of the last winding are connected to the terminals of the matching network that is connected to the RF generator.

Further, in certain specific embodiments, the first winding of the transversal antenna is provided with an igniting solenoid positioned near the bottle neck, and input of the first winding is connected to the matching network through the igniting solenoid. Also, in certain embodiments, aforementioned igniting solenoid, together with an argon supply tube enveloped by such a solenoid, constitutes a generator of charged particles triggering the ICP discharge inside the hollow container.

The central gas tube enveloped by the transversal antenna and used for delivering the process gas into the vacuum chamber is provided with holes distributed nonuniformly on the lateral surface for gas injection. This distribution depends on the curvilinear profile of the inner surface of the hollow container and geometry of a three-dimensional winding that matches the aforementioned profile.

Distribution of the injected gas, controlled by nonuniform distribution of these holes, adjusts the plasma density that, in turn, provides substantially uniform and continuous deposition of the barrier layer from the generated plasma resulting from the plasma chemical reaction.

Each coating station comprises a transversal RF antenna mounted on the antenna holder and a winding that matches the profile of the aforementioned curvilinear inner surfaces. The dimensions of this winding allow its penetration through the container's mouth into the container during haft of this container on the antenna. The antenna holder seals the inner container volume after contact with the lip of the neck of the container. A gas supply tube supplies this volume by the process gas that is a mixture having a first gas component provided by evaporation of organosilicon liquid. A second gas component is oxygen provided from an oxygen container. Altogether, these assembled components constitute an individual PECVD chamber where the plasma chemical reaction occurs. Suitable organosilicon liquids include siloxanes such as hexamethyldisiloxane (HMDSO), 1,1,3,3-tetramethyldisiloxane (TMDSO), and octamethylcyclotetrasiloxane; alkoxysilanes such as amyltriethoxysilane, ethyltriethoxysilane, isobutyltriethoxysilane, and tetramethoxysilane; silazanes such as hexamethyldisilazane; and fluorine-containing silanes such as trimethyfluorosilane.

The plasma-enhanced chemical vacuum deposition of the barrier layer from the process gas is carried out with plasma, which is not interrupted but rather constantly sustained alternatively either in a high-density mode capable of causing a plasma chemical reaction between the $SiO_2$-generating gases or in a low-density glow discharge mode where RF power is not high enough to provide a plasma chemical reaction for barrier-layer deposition but enough to generate the charged particles in the container in order to maintain the system in readiness in order to restore quickly the deposition process. The dummy load provides transformation from one mode to another. The drawback of abrupt discontinuing of plasma in a conventional mode of deposition of a barrier layer is that a new breakdown is needed to start the discharge again. However, in accordance with the preferred practice of this invention, the ICP discharge generated by the transversal antenna is depleted by reducing RF power, which is not completely interrupted. Continuous presence of plasma helps to save charged particles, and a new breakdown is not needed. In accordance with the invented method, discharge is depleted by intercepting the power with the RF power dummy loads that are comprised of a sealed vessel, or vessels, filled with an inert gas, e.g., argon. The discharge in the dummy load is triggered by the igniter, which is connected to the high-voltage pulse generator. The period of sustaining plasma in the dummy loads is used for cooling the plastic containers from overheating with an elevated temperature.

More specifically, the discharge in each dummy load is coupled with the transversal electromagnetic field of the antenna, absorbing a valuable part of the RF power. The igniter comprises an electrode immersed in the argon volume and generates a spark for breakdown of the dummy load's gas volume.

In accordance with the invention, the high-voltage pulse generator serves as an alternator of the PECVD process from the deposition mode to the cooling mode. The high-voltage pulse generator forms a pulse interval in order to cool the inner walls of the containers with process gas.

The transversal antenna comprises a plurality of coils distributed regularly relative to the axis of a hollow container, wound in the orthogonal direction, and configured in accordance with the inner profile of the hollow container or the mouth of the container, such as a bottle. The antenna generates a plurality of electromagnetic fields directed to the inner walls of the hollow converter and converted into a plurality of the electrical fields that, in own turn, are converted into relatively uniform plasma having increased density near the walls of the containers.

DETAILED DESCRIPTION OF THE INVENTION

Figure 1:
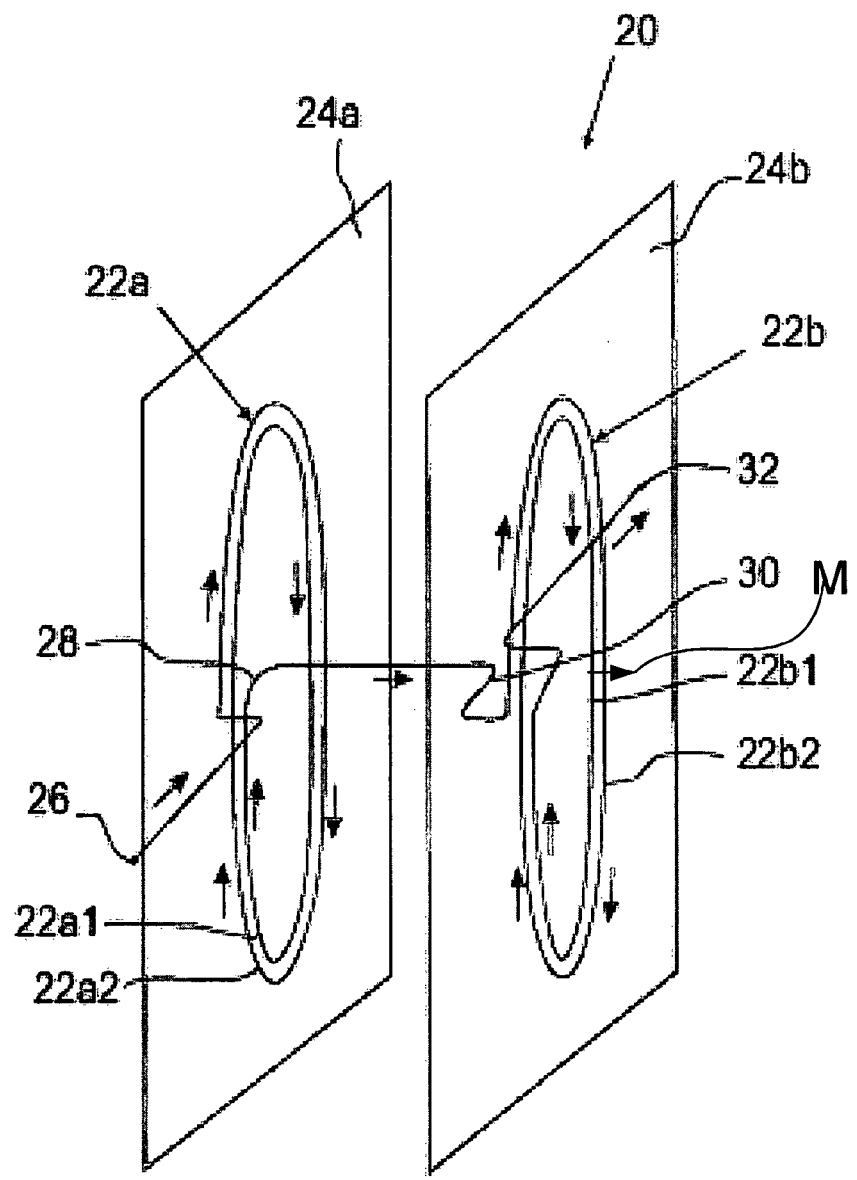
FIG. 1 is a three-dimensional view of the ICP transversal antenna of the invention.

Since the key part of the apparatus of the invention for coating the inner surface of hollow containers, such as bottles, is a novel multicoil transversal inductive antenna that imparts a new quality to the entire bottle coating apparatus, it would be advantageous first to consider the aforementioned antenna in more detail. The transversal RF antenna of this apparatus generates an inductively coupled plasma (ICP) discharge. The term "transversal" includes an antenna with saddle-like coils wherein all turns of the antenna winding are formed by wrapping a wire around a cylindrical mandrel that has a diameter less than the diameter of the container's mouth, if the mouth is round. For a cylindrical mandrel, the turns of each saddle-like coil may have an angular, elliptical, oval, rectangular, tapered, or nontapered configuration, depending on the configuration of the hollow container. The turns inherit the same bending radii as the mandrel. Taking into account the fact that the antenna is immersed into the gaseous volume, all turns are separated from each other to prevent high-voltage breakdown between neighboring turns.

One may express the relation between breakdown voltage $V_B$ and distance d between turns as:

$$V_B = Apd/\ln(pd) + B, \quad (1)$$

where p is pressure in the volume where the antenna is immersed, d is critical distance, pd is the Paschen minimum, and A and B are constants, depending on geometry of the antenna.

Each next turn has an increased width and height increased, as compared with the central turn. The determination "transversal" includes an antenna with solenoid-like coils, wherein the turns are formed by wrapping the wire around several azimuthally arranged mandrels, which are joined to the central axial mandrel of the constitutive fixture. In this case, the turns have the same geometry but are separated in the radial (relative to the axis of the mouth) direction with clearance that is large enough to prevent high-voltage breakdown between neighboring turns. The determination "transversal" also includes an antenna with coils wherein the turns are wrapped as a solenoid with a radially increased size. Each turn can be larger in the radial direction to the wall of the hollow container in order to fill out the total space of the hollow container by the wire, especially of the container without a neck, in order to develop a plasma column in the vicinity of the inner surface of the container inside the narrow space between the inner surface of the container and the front turns of the solenoids.

Also, the radius of curvature of an outward turn of each solenoid is increased as compared with the inward turn. In this case, high uniformity of coating and high rate of deposition can be provided with relatively low RF power.

The geometry of each turn of each spiral coil can be different. In a two-dimensional projection, it can be rectangular, tapered rectangular, elliptical, or oval, with the plane of symmetry coincident with the axis of the mouth of the hollow container and normal to the inner surface of the container. In the axial projection, the spiral coils are distributed angularly and uniformly with increments of 180/n, where n=1.2.3 ... m.

The transversal antenna is comprised of multiturn coils connected in series or in parallel. The coils can be spiral coils or solenoids azimuthally distributed relative to the axis of the mouth of the hollow container through which the antenna is immersed into the hollow container.

Each turn is made from a copper wire or a copper tube, and an outward turn of each coil is bent with a radius of curvature equal to or less than the radius of curvature of the mouth of the hollow container. For a container without a mouth or pipe, each outward turn of each coil is bent with a radius of curvature less than the radius of curvature of the inner surface of such container or pipe. It is understood that for an open container, such as a cap, wine goblet, etc., the outward turn approaches the inner surface with a distance sufficient enough to provide a high rate of deposition and high uniformity of the barrier coating but with a clearance that prevents melting of plastic during deposition.

Although the transversal antenna immersed in the hollow container generates the same ICP discharges as the axial solenoid immersed in the RF light bulb, distribution of plasma density in these discharges is different because of the different direction of magnetic flux induced by such antennas. The magnetic flux of the axial solenoid antenna is directed along the longitudinal axis of the bulb and transforms the high electric current into plasma oriented in the direction of this longitudinal axis. Accelerated electrons have higher ionization efficiency. They create higher plasma density along the axis and in the vicinity of the bottom of the bulb in order to produce high axial brightness of the plasma. The transversal antenna of the invention directs the electromagnetic field toward the walls of the hollow container. Because of this direction, electromagnetic fields of the several angularly distributed coils are transformed into plasma by high current in the vicinity of the inner surface of the hollow container. The higher the ionization efficiency and the greater the electron density near the inner surface of such a container, the higher is the rate of the deposition of $SiO_2$ from plasma, and the higher is the intensity of the chemical reaction between organosilane and oxygen.

Simultaneously with deposition, the plasma heats the interior surface of the container, and this, to some limit, increases density of the deposited coating and enhances barrier properties thereof. The duration of the deposition must be very short; otherwise, the plastic can be softened, even molten, and the hollow container can collapse. The outward turn approaches the inner surface within a reasonable limit.

The azimuthally distributed coils provide uniformity of such deposition. The transversal antenna comprises an even number of sets of windings that can be connected in series or in parallel. In any case, the direction of the electromagnetic fields of the opposite coils is supposed to be the same; otherwise, the total electromagnetic field would be weakened, plasma density would be reduced, coating would be nonuniform, and impedance of the antenna and reflected RF power would be increased. The angular increment of the azimuthally distributed coils is supposed to equal 80/n, where n=1,2,3, ... m. It is understandable that the higher the n, the more uniform the thickness of the deposited thin film.

A three-dimensional view of a transversal RF antenna 20 of the invention is shown in FIG. 1. Since the ICP transversal inductive antenna 20 has a three-dimensional configuration, positions of some parts of the antenna 20 will be considered with reference to an orthogonal XYZ coordinate system, as shown schematically in FIG. 1.

In the embodiment shown in FIG. 1, the saddle-like version of the transversal antenna has a winding 22 that consists of two parts, i.e., an ICP transversal antenna winding part 22a arranged as a separate coil substantially in a first XZ plane 24a and an ICP transversal antenna winding part 22b, which is arranged as another separate coil in a second XZ plane 24b. Input of the first coil and output of the second coil arrangements are connected to an RF power supply (not shown) that provides RF current flowing in the same direction in both coils. Such an arrangement allows the total magnetic flux, produced by both coils, to be increased. This total magnetic flux, which is shown by arrow M in FIG. 1, is transversal relative to the axis of the mouth of the container and normal to the walls of this container (shown and described below, e.g., a bottle 422 shown in FIG. 7). The total magnetic flux transforms the electrical field in plasma that is close to the walls. It is understood that in the embodiment shown in FIG. 1, the planes 24a and 24b and, hence, the winding parts 22a and 22b, are shown schematically as flat. It is understood that they are being wrapped on a lateral surface of the mandrel and, in reality, inherit a radius of curvature equal to or less than the radius of curvature of the mouth of the container. It is also understood that the turns need not be arranged on a flat plane along curvilinear profiles, such as cylindrical or taped cylindrical profiles, which, depending on the radius of curvature can be equal to or less than the radius of the container's mouth. It is understood that the turns can be circular, rectangular, rectangular tapered, elliptical, oval, or of another shape. In this case, each next turn will have an inner area larger than the previous area, and the distance between the neighboring turns must exceed one critical from the viewpoint of high potential breakdown between the neighboring turns.

The first antenna winding part 22a may have two or more bent turns that may have different configurations and dimensions selected in compliance with the specific object and object profile to be treated. For example, configuration of the turns may be rectangular, rectangular tapered, circular, elliptical, or oval. In the specific embodiments shown in FIG. 1 for the purposes of example only, the antenna winding part 22a has a spiral shape that consists of a small oval-shaped turn 22a1 and a large oval-shaped turn 22a2. An input terminal 26 of the large oval-shaped turn 22a2 of the first antenna winding part 22a is connected through a matching network (not shown in FIG. 1) to the first terminal of an RF power source (not shown in FIG. 1), while an output terminal 28 of the first antenna winding part 22a is connected to an input terminal 30 of the second winding part 22b. An output 32 of the second winding part 22b is connected through the matching network to the second terminal of an RF power source (not shown in FIG. 1). It is understood that the entire circuit from the input terminal 26 of the first winding part 22a to the output terminal 32 of the second winding part 22b is continuous and has a series connection. Arrows show direction of the current that provides the electromagnetic field in each winding part with the same direction.

Figure 2:
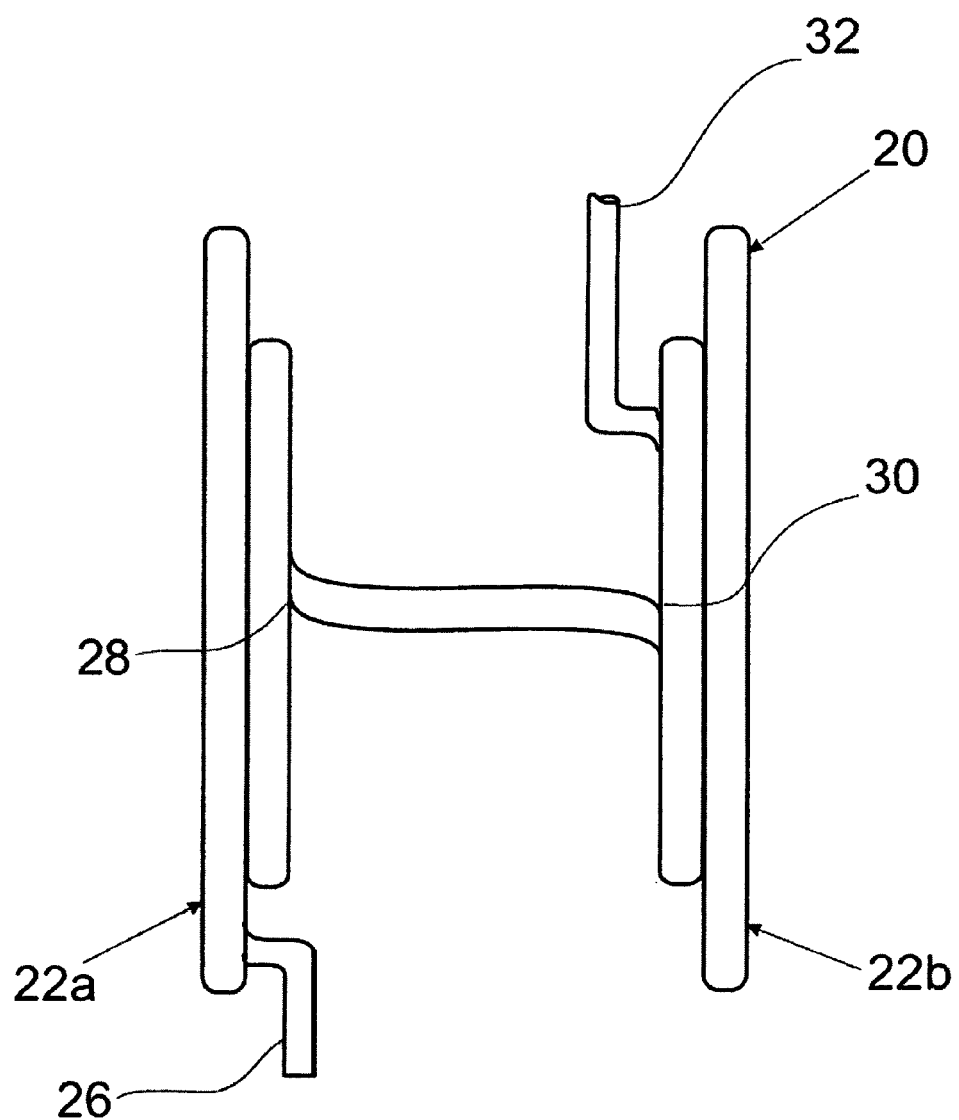
FIG. 2 is a top view of the ICP transversal antenna of FIG. 1, the antenna being composed of spiral coil parts arranged in flat planes.
Figure 3:
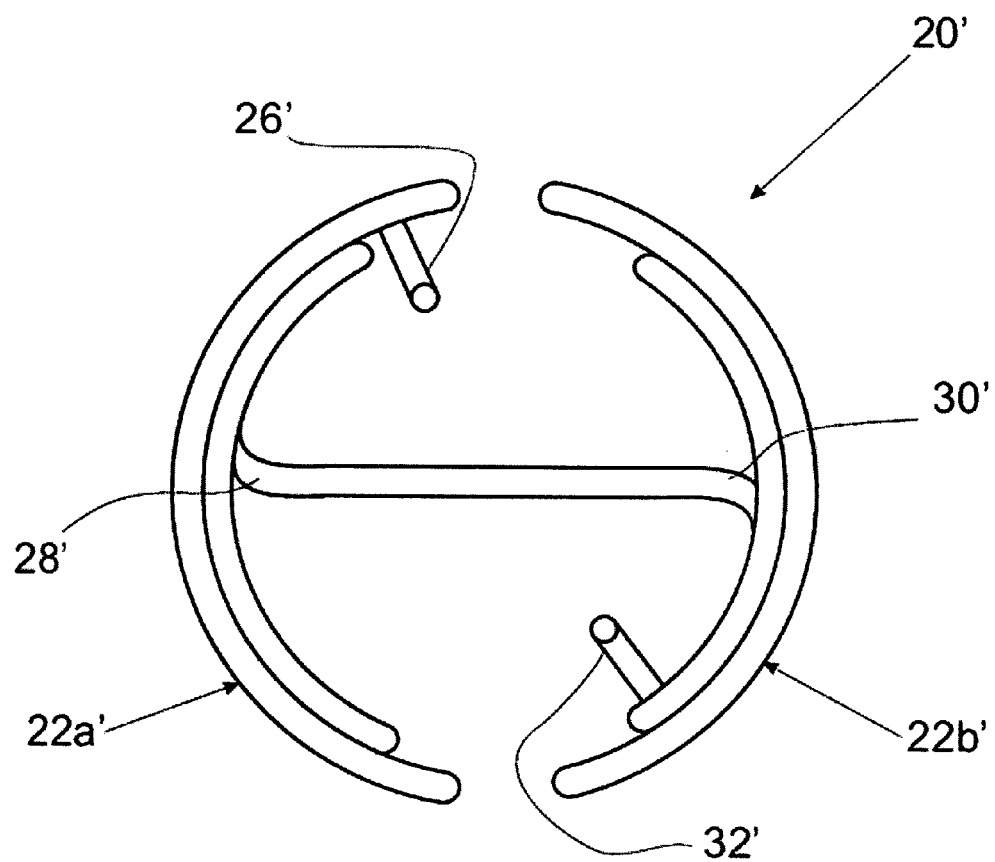
FIG. 3 is a view similar to FIG. 2 but for the transversal antenna composed of spiral coil parts which in a top view have curvilinear or saddle-like profiles.

FIG. 2 shows a top view of the transversal RF antenna 20. It can be seen from FIG. 2 that in the embodiment of the antenna 20 shown in FIG. 2, the first and second antenna winding parts 22a and 22b are located in mirror positions in parallel planes and therefore have flat configurations. However, the antenna winding parts 22a and 22b may also have curvilinear configurations inherited from the curvilinear configuration of the mandrel (not shown in FIG. 2) onto which they are wrapped according to the radius of curvature of the mouth of the container or according to the radius of curvature of the curvilinear inner surface of the open container. This is shown in FIG. 3, which is a top view of the antenna similar to one shown in FIG. 2 and is designated by reference numeral 20'. Parts of the antennas shown in FIG. 3, similar to those of the antenna 20 in FIGS. 1 and 2, are designated by the same reference numerals but with the addition of a prime. For example, in the antenna 20', the input terminal of the large oval-shaped turn of the first antenna winding part 22a' is designated by reference numeral 26', and so forth.

Figure 4:
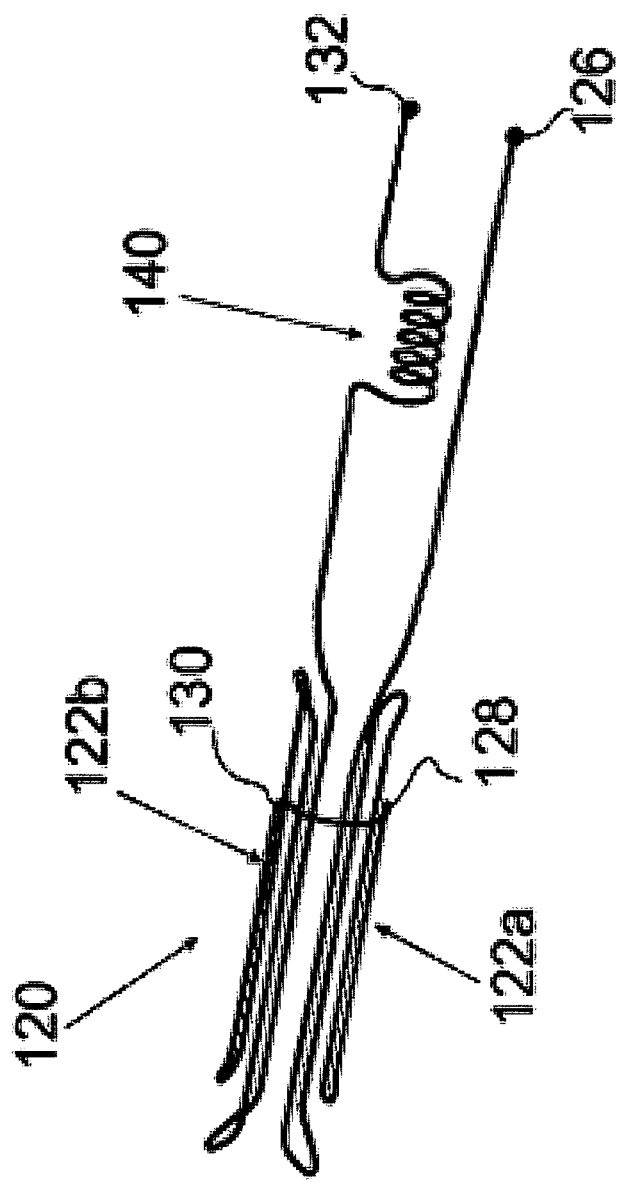
FIG. 4 shows a modification of the transversal antenna of the present invention, the antenna having an elongated shape suitable for insertion into a bottle with a narrow neck and a saddle-shaped profile in a top view for matching to the shape of the bottle inner wall.
Figure 5:
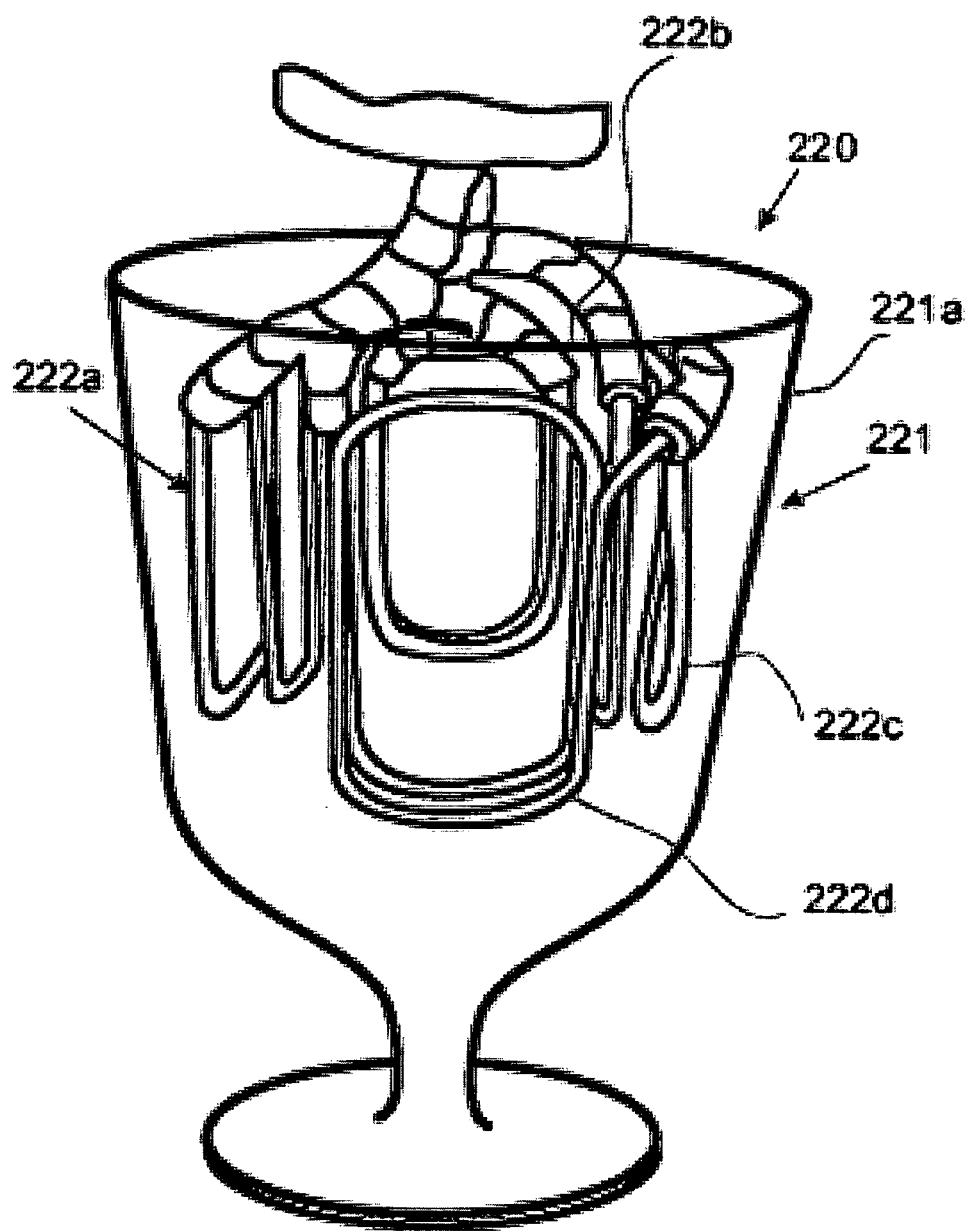
FIG. 5 is a three-dimensional view of the transversal antenna of the invention that consists of four curvilinear solenoid parts inserted into a container of a tapered shape, such as a wine goblet.

FIG. 4 shows a modification of antenna 120 of the present invention, which has an elongated shape suitable for insertion into a bottle with a narrow neck and a saddle-shaped profile in a top view to match the shape of the inner wall of a bottle. Parts of the antennas shown in FIG. 4, which are similar to those of the antenna 20 in FIG. 1, are designated by the same reference numerals but with the addition of 100. For example, in the antenna 120, the input terminal of the large oval-shaped turn of the first antenna winding part 122a is designated by reference numeral 126, etc. In antenna 120 of FIG. 4, reference numeral 140 designates a solenoid joined to the antenna coils that can envelop a second gas tube connected to the reservoir with argon and constitute with such a gas tube a trigger for ignition of plasma discharge. The trigger coil 140 is connected in series with the output 132 of the winding part 122b of the antenna 120. Topology of windings in the antenna 120 is similar to the topology of the first and second winding parts of the antenna 20, but the shape of the winding parts is elongated and matches the shape of the inner walls of a bottle for uniformity of the coating to be applied onto these inner walls. The antenna of the invention is not limited to cylindrical configurations and may be outlined for treating containers having inner walls of conical, semispherical, or other curvilinear shapes, e.g., shapes of varying curvatures. The antenna 220 of the invention modified for treating, e.g., conical surfaces, is shown in FIG. 5, which is a three-dimensional view of the antenna 220 inserted into a wine glass 221. It is understood that the antenna 220 and the wine glass are located in a closed-volume vacuum chamber (not shown). The antenna 220 is similar to one shown in FIGS. 1 and 2 and consists of four antenna parts, or four coils 222a, 222b, 222c, and 222d. Each coil consists of two or more turns, an outward turn and an inward turn, with the radius of curvature decreasing toward the center. The difference in radius is greater than the threshold for breakdown between neighboring turns. In order to conform to the tapered shape of the glass wall 221a, the antenna parts 222a, 222b, 222c, and 222d taper in the downward direction (i.e., they are inclined relative to vertical axis Z, as shown in FIG. 1). The structure of each antenna part is the same as in the antenna of FIG. 1.

In addition to antenna design, two aspects provide thermal preserving of the plastic material during coating and arrangement in the stationary position of the units. The function of these units is to generate electromagnetic energy and to supply process gas to the coating station. The periodical disconnect of these units from RF power, process gas, water supplies, and pumping communication would, therefore, hugely increase the burden on the apparatus for PECVD. To prevent damage to the plastic material, especially biodegradable plastic, by excessively high plasma temperature, thermal flux generation periods are alternated with periods of cooling and removing byproducts of the plasma chemical reaction. This happens while providing activating energy needed to decompose the process gas for generation of silicon dioxide that is deposited onto the inner walls of the plastic containers. In the context of the process according to the invention, it is appropriate to use pulsed plasma to allow material-preserving coating of the temperature-sensitive biodegradable plastic substrate. A pulsed plasma ratio, also known as a duty ratio, is defined as the ratio of pulse duration to the pulse space interval. During pulse duration, on one hand, a great amount of RF power is supposed to be introduced to ignite and to sustain plasma discharge. On the other hand, thermal shock of hot plasma generated by such RF pulse, particularly for biodegradable plastic, can be drastically reduced during the following pulse space interval when byproducts are removed. Cold-process gases and auxiliary gases, such as argon, cool the inner surfaces of the plastic containers.

Conventional methods for providing a period of cooling by modulating the pulse generated by an RF-power generator in a PECVD process used for depositing a barrier layer onto the inner walls of plastic containers are inapplicable for the method and apparatus of the invention based on generation of an ICP. For this reason, these conventional methods have the following disadvantages.

1. During transmission through the capacitors of the matching network that delays the start and collapse of the ICP discharge, the aforementioned modulation distorts high-voltage pulse. High frequencies that derivate from a sharp-shape pulse lead to mismatching of antenna and impedances of the high-frequency generator. This mismatching leads to reflection and to losses of high-frequency power.
2. Fast switching of the RF generator generates high reflected power that overloads the generator and reduces its life time.
3. Total interruption of plasma discharge completely eliminates charge particles, and therefore another increase in RF power for breakdown of the gaseous volume is needed in order to initiate the next plasma discharge.

Therefore, it would be advantageous to provide the barrier-layer deposition period with a short interruption without interrupting the RF generator and keeping the generator constantly loaded even without discharge. It is also advantageous during nondeposition to maintain plasma periods at a very low level of power consumption, i.e., in the glow mode, wherein charged particles are still generated with sufficient quantity to restore the deposition cycle. Thermal flux irradiated by such depleted plasma is not sufficient for significantly heating the inner wall of the container.

Due to irradiation of a strong transversal magnetic field during circulation of RF current through the transversal antenna that propagates far from the antenna, it is possible to sustain plasma in two different and alternating states, thus distributing RF power between the working discharge cycle in the container into which the antenna is immersed and the plasma-sustaining cycle in a dummy load with the igniter connected to the pulse generator. The discharge of the second type absorbs RF power during the period of time that is used for cooling the inner walls of the containers.

Normally, apparatuses for coating hollow containers are developed in the form of a continuous production line with a fast load-lock system for transfer of each hollow container from ambient air to vacuum. Such apparatuses may also be made in the form of a carousel system wherein a plurality of coating stations rotates, bringing containers with antennas immersed therein one by one from ambient air to the vacuum chamber. Such a system also requires fast disconnection of RF circuits, gas supply units, water-cooling systems, etc., for each operation cycle. However, aforementioned load locks and disconnections significantly increase the cost of the entire system and reduce its already low reliability.

Conventional, continuous production lines for deposition of coating layers onto the inner walls of hollow containers also require strict tolerances for positioning dynamic container catching means (bottleneck catching means if the containers are bottles) while the conveyor continuously moves the containers. These conventional, continuous production lines also require precision alignment at high speeds of a conveyer, as well as frequent and accurate maintenance. Smashing of just a single container leads to failure of the total barrier-coating process as well as filling one.

According to the invention, the process for producing barrier coatings operates without interruption of process gas supply and RF power to the units of the apparatus.

Figure 6A:
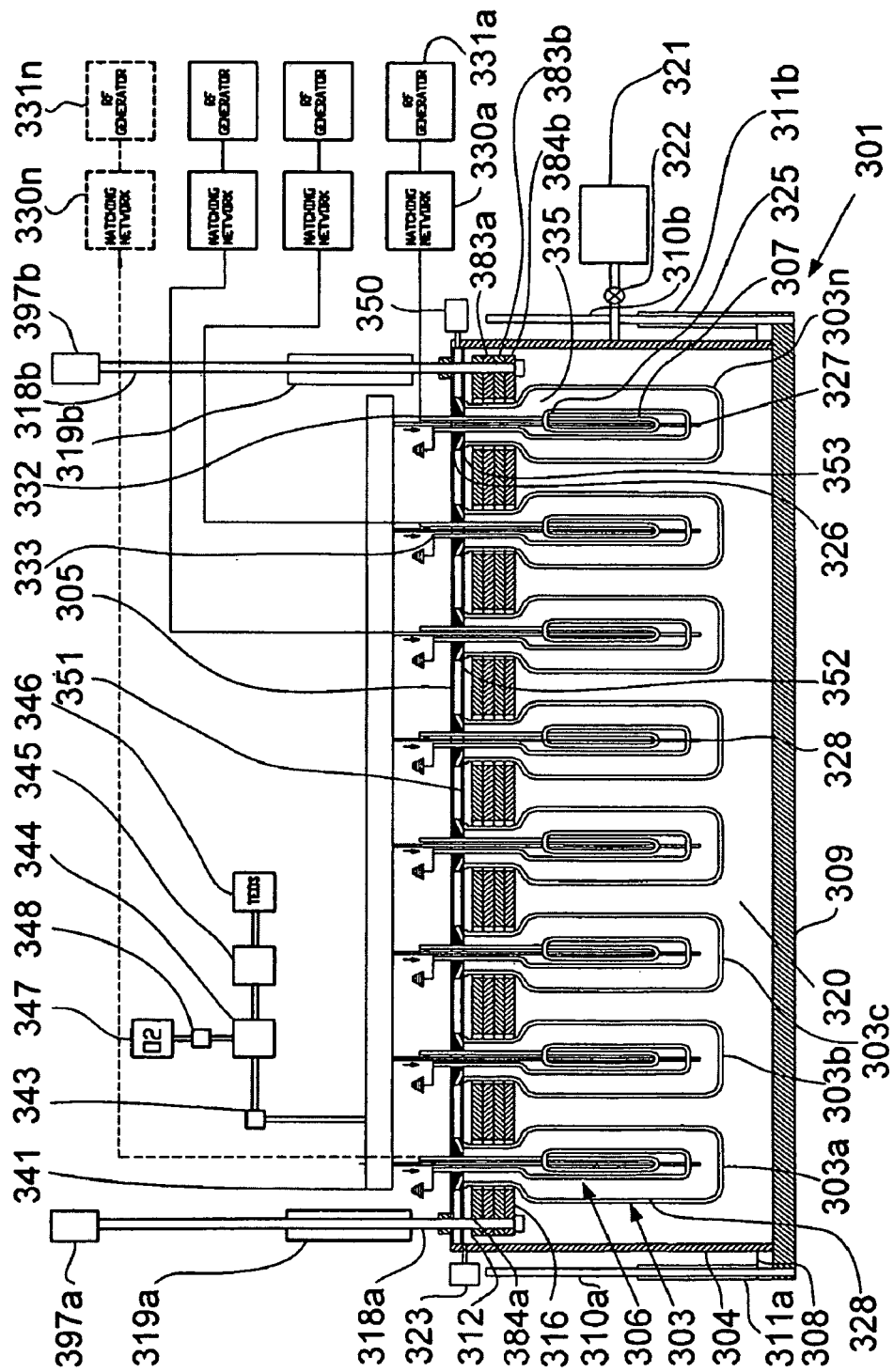
FIG. 6a is a cross-section of the vacuum chamber with the array of individual PECVD chambers that comprise coating stations formed in the containers.
Figure 6B:
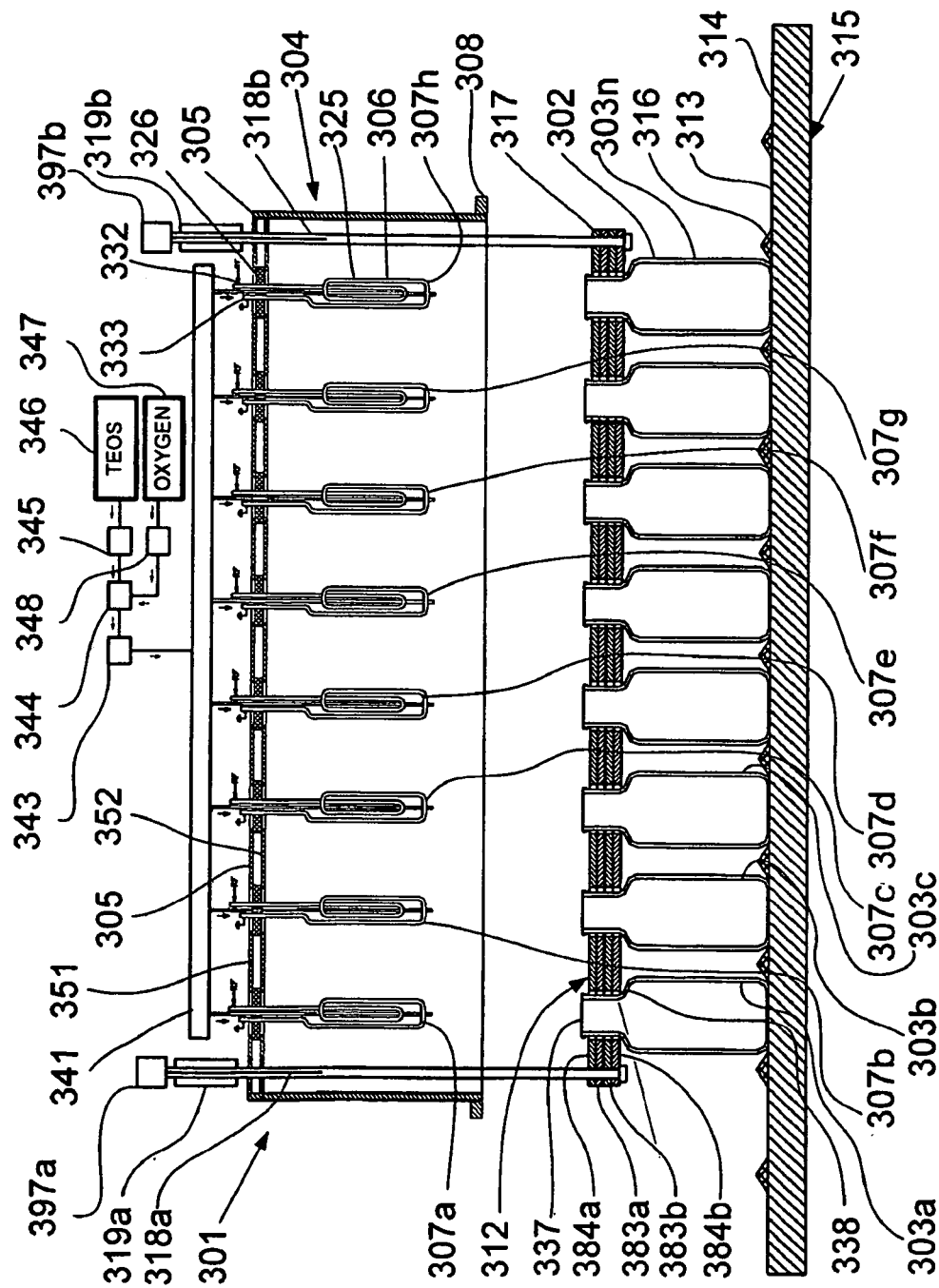
FIG. 6b is a cross-section of the vacuum chamber with a clamping device.

As shown in simplified form in FIG. 6a, 6b, 6c, 6d, the apparatus of invention provides simultaneous application of barrier coatings by PECVD process for a plurality of containers. The apparatus 301, shown in FIG. 6a, provides simultaneous barrier coating for an array 302 of containers 303a through 303n. The apparatus 301 comprises a vacuum chamber 304 that consists of a coating panel 305 with an array 306 of the coating stations 307a through 307n (FIG. 6b). The panel 305 is maintained on the back of the chamber 304. The coating stations 307a through 307n are immersed into the chamber 304. The chamber 304 also comprises a front flange 308 with a door 309 (FIG. 6a) maintained on the shafts 310a and 310b, which are driven by the linear actuators 311a and 311b.

Figure 6C:
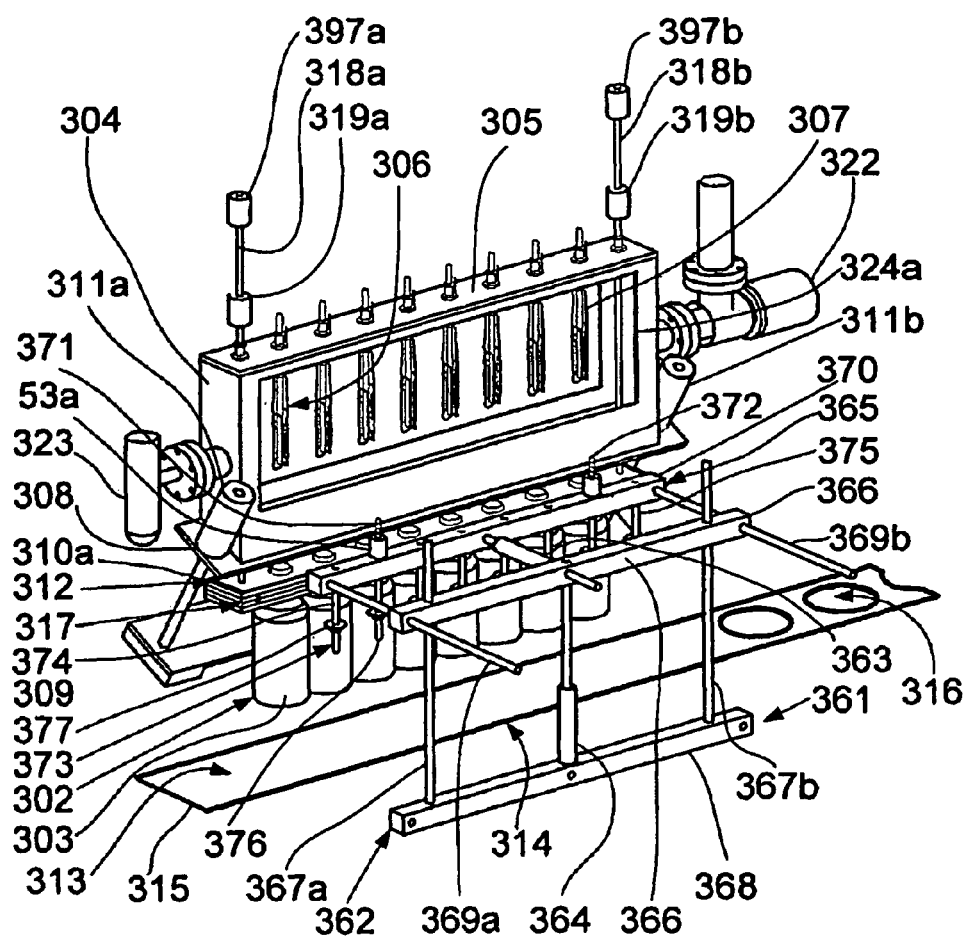
FIG. 6c is a total view of the barrier-coating production line.

The door 309 serves as a periodical opening of the chamber 304 when it is necessary to introduce an array 302 of the containers 303a through 303n into the chamber 304 for deposition of the barrier layer or for removal of the containers after the deposition process is completed. During deposition, all containers 303a through 303n are locked in a movable clamping device 312 (FIG. 6b). The clamping device 312 secures positions of the containers 303a through 303n (FIG. 6a) with the same distance between containers in the array 302 as the distance between coating stations 307a through 307n. The clamping device 312 also provides capturing of the containers 303a through 303n from the flat part 313 of the belt 314 of the conveyer 315 and delivers the deposited containers 303a through 303n to nests 316 in the belt 314 of the same conveyer 315 (FIG. 6c). More specifically, the conveyor belt 314 has a flat portion 313 on which the containers are aligned and a nested portion 316 with nests that are strictly aligned with the containers in their aligned state and into which the clamping device places the aligned containers.

In order not to overload the drawings and specification, some multiple components, e.g., containers 303a through 303n will be designated by a single reference numeral, e.g. instead of containers 303a through 303n, each container will be designated by a single reference numeral 303, although it is understood that the number of containers is "n" and corresponds to the number "n" of filling stations 307a through 307n, etc. Nests 316 serve as cartridges to secure the interval between the containers 303, which is also equal to the interval between nozzles of a filling device (not shown) whereto the containers are delivered. The clamping device 312 provides capturing and holding of the containers 303 using the neck-locking mechanism 317.

Movement of the neck-locking mechanism 317 of the clamping device 312 is performed by using arms 318a and 318b driven by linear actuators 319a and 319b and used as carriers of the array 302 of the containers 303 (see FIG. 6b). Evacuation of air from volume 320 of the vacuum chamber for deposition of the barrier layer on the inner walls of the containers 303 is provided by a pump 321 through a vacuum valve 322. Control of pressure inside the chamber 304 is provided with a Baratron 323 (FIGS. 6a and 6c).

Figure 6D:
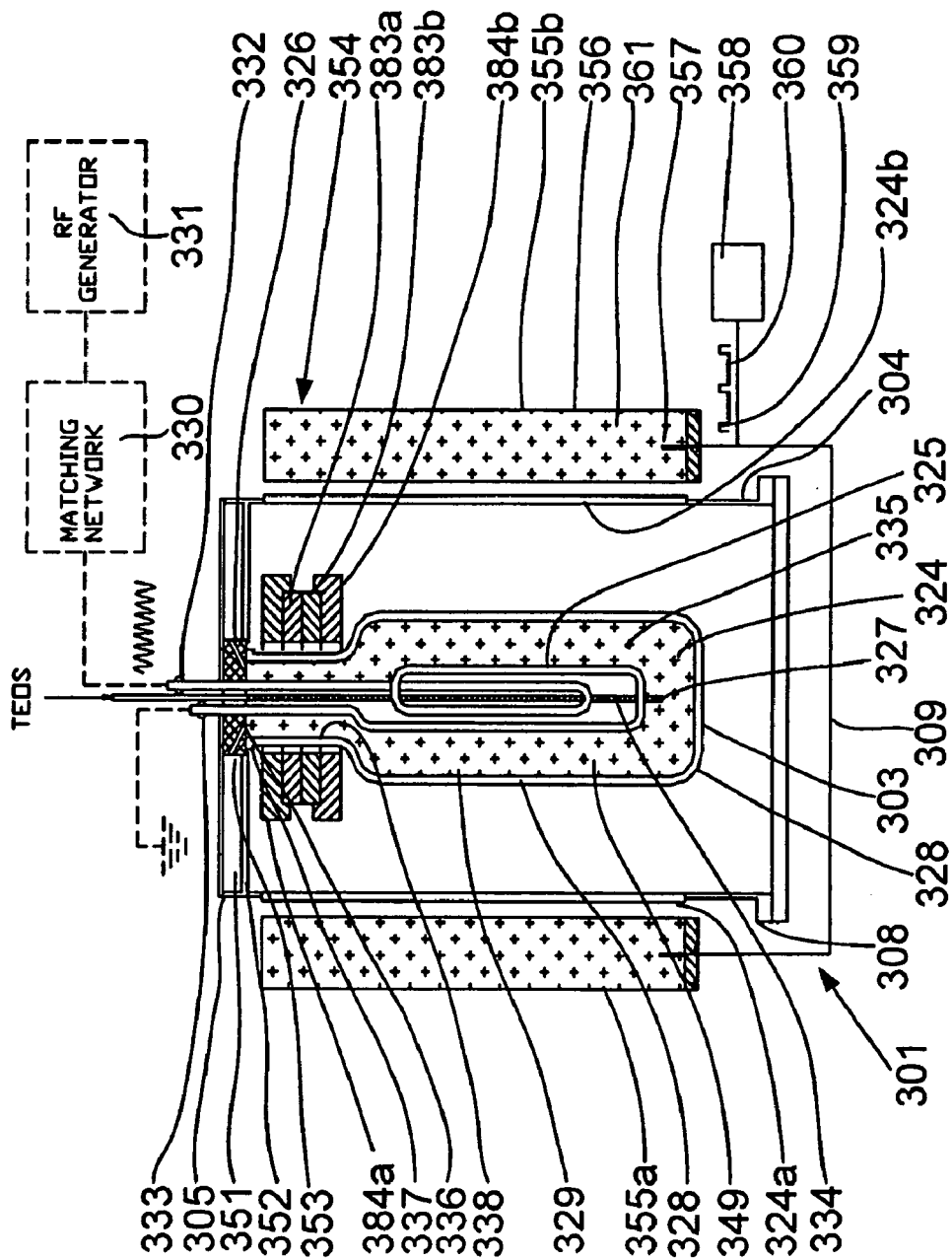
FIG. 6d is a schematic view of the process of coupling the antenna and dummy loads.

The chamber 304 also includes two quartz windows 324a and 324b situated on both sides of the chamber 304 (FIG. 6d). Each coating station 307 comprises a transversal antenna 325, antenna holder 326, and a process gas supply tube 327.

Each container is periodically clamped to the respective antenna holder 326. The coating stations 307 and respective enveloping containers 303a through 303n sealed by the surface of the antenna holders 326 constitute individual PECVD chambers 328 that serve to deposit barrier layers 329 of the silicon dioxide onto the inner surfaces of the containers 303a through 303n.

Each transversal antenna 325 of the coating station 307 has a high RF current connection with a matching device 330 and an RF generator 331 that applies RF current to the antenna 325 through a terminal 332 (FIG. 6d). Another terminal 333 of the antenna 325 is grounded. The gas feeding tube 327 with nonuniformly distributed holes 334 on the lateral surface serves to deliver a process gas to the volume 335 of the container 303 (FIG. 6a). After being filled with process gas, the volume 335 is sealed with the lip 337 of the neck 338 of the container 303 against the surface 336 of the antenna holder 326.

Each gas supply tube 327 of the coating station 307 is connected to the gas manifold 341, which uniformly distributes the process gas between volumes 335 of the individual PECVD chambers 328. Through the process gas flow controller 343, the manifold 341 is connected with a mixer 344, an organosilane vaporizer 345, and a tank 346 that contains organosilane (TEOS), as shown in FIG. 6a. Oxygen is delivered to the mixer 344 from the oxygen tank 347 through the oxygen flow controller 348. This mixture is used for the plasma chemical reaction that is caused in each container 303 under the effect of plasma discharge 349 generated in each container by the transversal antenna 325. (FIG. 6d). Silicone dioxide, which is a product of the plasma chemical reaction, is deposited onto the inner walls 329 of each container 303 by forming a fluid-impermeable barrier layer 329 (FIG. 6d). Pumping of the volume 335, separated from the volume of the chamber 304 inside the containers 303, and removing byproducts of the plasma chemical reaction, such as carbon dioxide and water, from this volume 335 are carried out by a pump 350 (FIG. 6a). Vacuum communication is provided through a sealed inner volume 351 of a hollow panel 305 that serves as a vacuum manifold 352 pierced by the antenna holders 326 and through the oblique holes 353 formed in the antenna holder 326.

In order to preserve the plastic material of the containers from a destructive heat flux irradiated by plasma, periodical cooling of the inner wall of the containers 303 is to be provided. The discharge shunting system 354 provides this goal comprises two dummy loads 355a and 355b, which are similar to the commercial light panels positioned outside the chamber 304 behind the windows 324a and 324b (FIG. 6d).

Each dummy load consists of a glass vessel 356 filled with argon and provided with an electrode 357 connected to a pulse generator 358. This generator 358 generates sequence of high-voltage pulses 359 with intervals between pulses 360 and serves as a trigger of plasma discharge 361 in the vessel 356.

The apparatus is provided with an array 306 of coating stations 307 spaced at intervals equal to intervals between the nozzles of the filling system into which the containers are fed on completion of treatment in the apparatus of the invention (FIG. 6b).

Such equalization allows for integration of the barrier-coating system of the invention into a commercial production line designed for filling the containers with beverages or other contents, with subsequent capping and labeling.

The conveyor 315 transports randomly positioned containers 303 from a supply hopper of the conventional container supplier (not shown). This conventional conveyor removes randomly oriented containers from the supply bin and then orients and roughly sequences the containers in a bottom-up, top-down orientation. Then the conveyor transports the containers to a turning plate and to a drop-chute, which turns the bottom-up, top-down containers to the top-up, bottom-down position. However, the aforementioned conventional system does not provide precise positioning and sequencing of these containers with equal distances between each other, which is needed for processing the containers in the area of the coating. In order to satisfy this requirement, the containers must be aligned and organized into an array, with intervals equal to those in the array of the RF antenna in the coating stations. The filling process also requires organization of the containers into an array, with distances between the containers that match those in the array of the coating stations. If in the array 302 the containers 303 are distributed with the same intervals as the coating stations and the filling nozzles of the filling station, sterilization of the containers can be omitted immediately after barrier coating and before filling the containers with a beverage.

Multinozzle filling of the containers with beverage is a process that must be carried out with high throughput and with short intervals between filling cycles, wherein movement of the conveyor is interrupted during filling. This means that the time allowed for the barrier-coating cycle will also be very short. On the other hand, cycle time of the coating system can be neither longer nor shorter than the cycle time of the filling station, and the entire production line should operate within the same operation cycle. In order to allow sufficient time for the coating cycle, it is necessary to accelerate portions of the process cycle such as: positioning of containers 303 on the conveyor 315 in the array 302, delivery of aligned containers 303 to the process chamber 304, sealing and evacuation of the vacuum chamber 304 with the coating stations 307, coating with a high deposition rate, and return of the coated containers to the conveyor 315.

It is understood that each container must be precisely aligned with the longitudinal axis of the transversal antenna 325 (FIG. 6a).

Thus, aligning is an important part of the vacuum barrier-coating process. An aligning system is integrated into an entire coating apparatus, wherein the clamping device 312 (FIG. 6c) traveling from the conveyor 315 to the coating chamber 304 and back belongs to both the conveyor and coating chamber. This clamping device 312 holds the containers in the vacuum chamber 304 during the barrier coating and catches the necks of the containers 303 in the aligned position, which is provided by the previously acting alignment mechanism.

The method of alignment preceding the process of barrier coating is working in a manner such that the containers 303 randomly positioned on the flat part 313 of the belt 314 of the conveyor 315 are automatically organized in an array with uniform distribution. The containers of the array are locked in order to secure the position. Means that provide such an operation include:

1. An aligning mechanism in the form of pipettes made from an inflatable material, such as rubber or plastic, that may have an inflated state and a deflated state. In the deflated state, the expandable members have diameters smaller than the openings of the containers, and in the inflatable state, the expendable members have diameters greater than the diameters of the containers so that when the pipettes are inflated, they are deformed into the form of balls, which are pressed against the inner walls of the container necks, and act as universal joints that provide self-alignment and shift the containers from unaligned positions to aligned positions.
2. A clamping device with an array of holes narrowing in size for capturing the necks of the containers.

Combined variability of the clamping and aligning devices allows for precise positioning of the containers and simultaneously for securing thereof in the aligned positions during deposition of the barrier layers.

This alignment method described above precedes the clamping step and provides positioning of the containers sufficient enough for catching the necks of the containers with the narrowing holes of the clamping device.

Figure 6E:
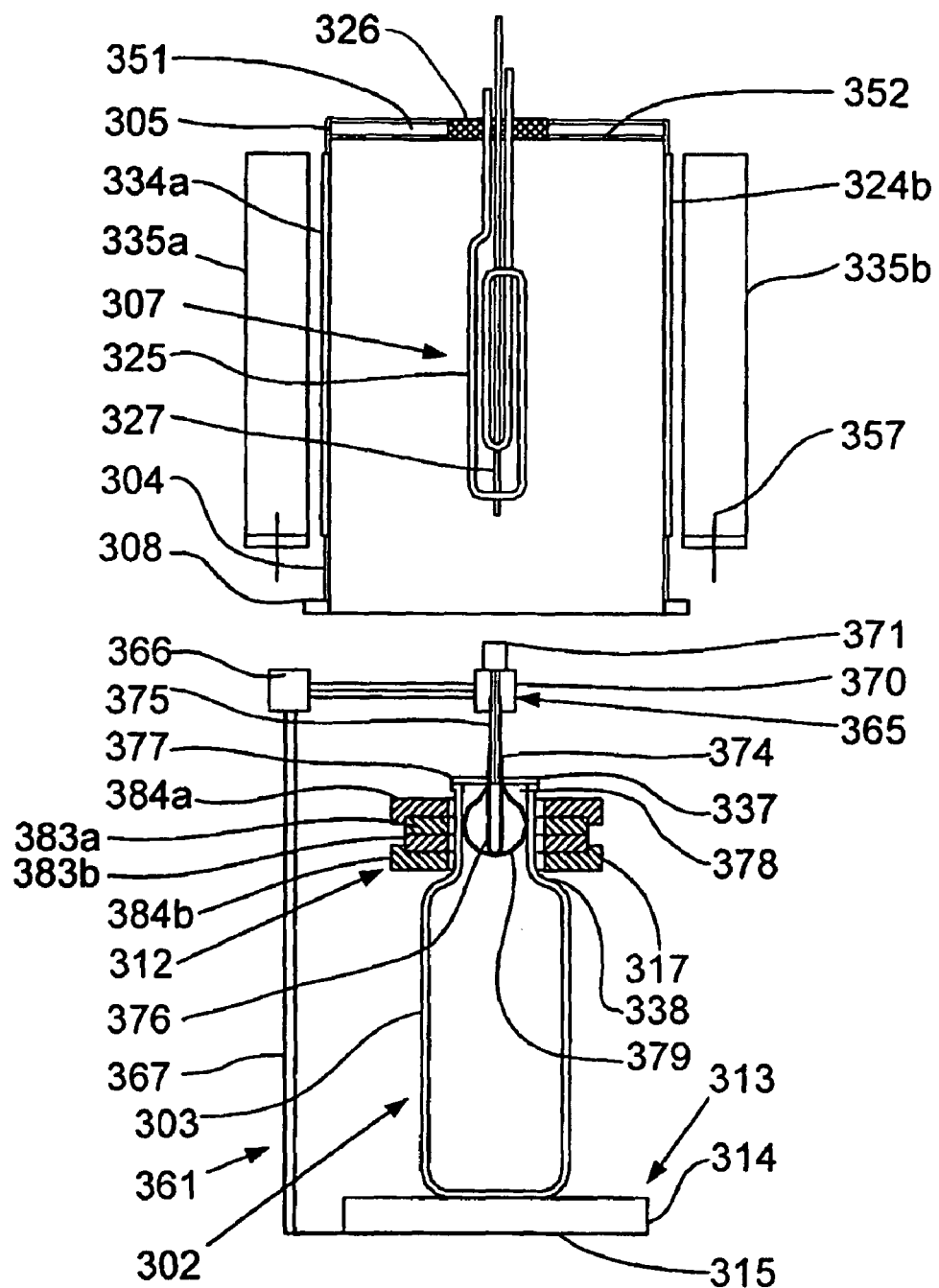
FIG. 6e is a schematic view illustrating the process of aligning the container.

The container locking system 361 incorporates the clamping device 312 illustrated in FIG. 6e. The locking system 361 (FIG. 6c) consists of a two-directional movement system 362 provided with horizontal (363) and vertical (364) actuators for movement of the slide aligning station 365 in two directions. Movement of the slide 366 and, hence, of the aligning station 365 supported by this slide 366 in the vertical direction, is carried out by the vertical linear actuator 364 along vertical guides 367a and 367b supported by a base 368 (FIG. 3c). Movement of the aligning station 365 in the horizontal direction along horizontal guides 369a and 369b is performed by a horizontal linear actuator 363. The horizontal linear actuator 363, as well as the horizontal guides 369a and 369b, is connected to the slide 366. The aligning station 365 is comprised of a manifold 370 joined to an air compressor 371 that supplies the manifold with compressed air and a vent 372 for draining air from the manifold 370. The aligning station 365 includes an array 373 of inflatable rubber fingers 374 on the end of the tubes 375 which are connected to the manifold 370. These tubes 375 serve as carriers of the fingers 374. They provide air communication between the manifold 370 and the fingers 374 in order to supply each finger 374 with pressurized air or to remove air from the fingers. All fingers 374 are organized into the array 373 with the same intervals as the intervals between the coating stations 306. Each finger 374 has a mushroom-like structure and consists of a pipette 376 hafted on the tube 375 and crowned by a rubber hat 377 that clamps the pipette 376 on the end of tube 374 (FIG. 6e). In fact, the pipettes 376 are made from an inflatable material, such as rubber or plastic, and may have an inflated state shown in FIG. 6e or a deflated state. In the deflated state, the expandable members have diameters smaller than the openings of the containers. In the inflated state, the expendable members have diameters greater than the diameters of the containers. Therefore, when the pipettes 376 are inflated, they are deformed into the form of balls 379, which are pressed against the inner walls of the container necks 338, and act as universal joints that provide self-alignment and shift the containers from unaligned positions to aligned positions.

Being carried by the aligning station 365, the array 373 of the fingers 374 can move horizontally in order to be positioned against the containers 303 distributed randomly on the belt 314 of the conveyer 315 (FIG. 6e). After alignment with the axes of the coating stations 307, the fingers 374 can be moved down by the vertical linear actuator 364 for immersing into the throats 378 of the necks 338 of the containers 303 and then up in order to contact the hat 377 with the lip 337 of the neck 338 (FIG. 6c and FIG. 6e). Although the container 303 may be misaligned with the axis of the coating station, each rubber pipette 376 still can occupy a small part of volume of the throat 378 (FIGS. 6c and 6e). After being blown out by pressurized air, each pipette 376 can expanded in the form of a ball 379 in order to fill the total volume of the throat 378 and to develop pressure against the inner walls of the container neck 338, thus holding the container 303. Since the inflated balls 379 act as universal joints that hold the containers 303, they move the containers into positions aligned with the axes of the respective fingers 374. The rubber hats 377 that press the lips 337 of the necks 338 against the belt 314 limit movement of the containers 303 (other than horizontal movement) for alignment with the axes of the coating stations.

Figure 6F:
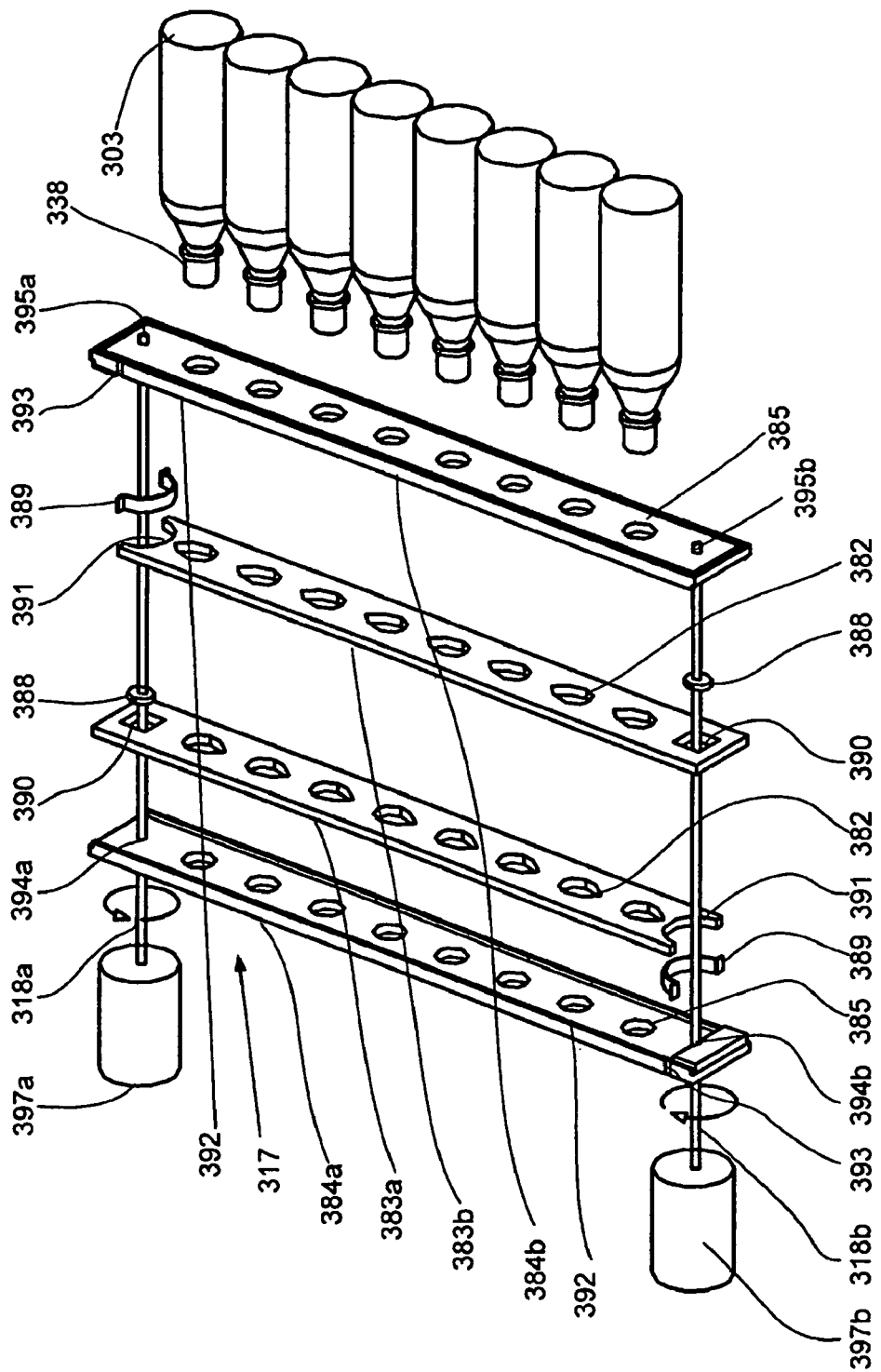
FIG. 6f is an exploded view of a clamping device with a neck-capturing mechanism.
Figure 6G:
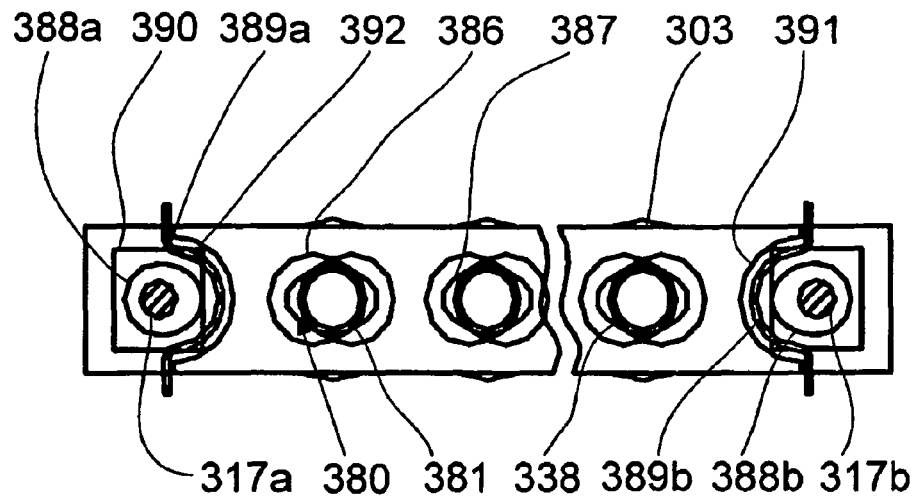
FIG. 6g is a view illustrating the process of capturing the necks of containers by the neck-capturing mechanism.
Figure 6H:
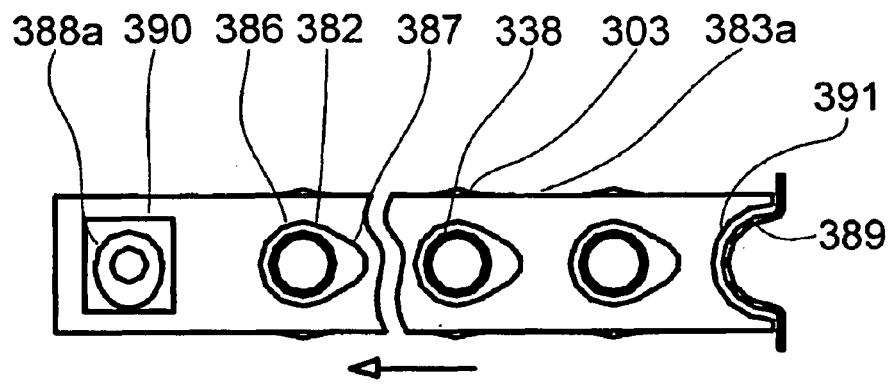
FIG. 6h is a view of the top sliding strip of the neck-capturing mechanism with cam and spring.
Figure 6K:
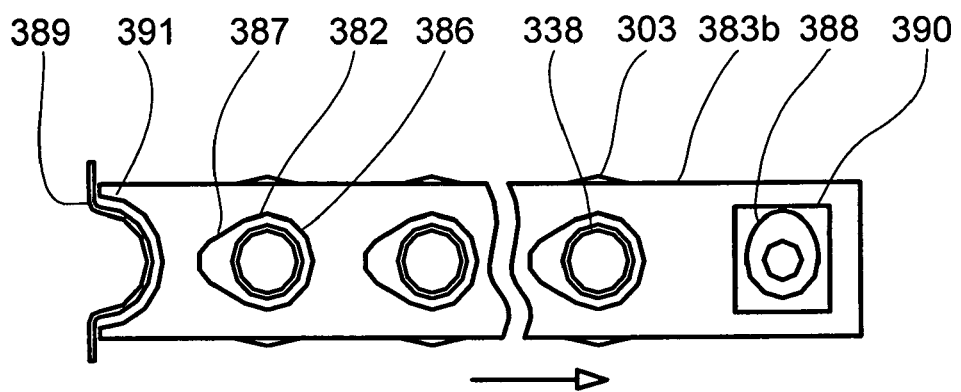
FIG. 6k is a view of the bottom sliding strip of the neck-capturing mechanism with a cam and a spring.
Figure 6L:
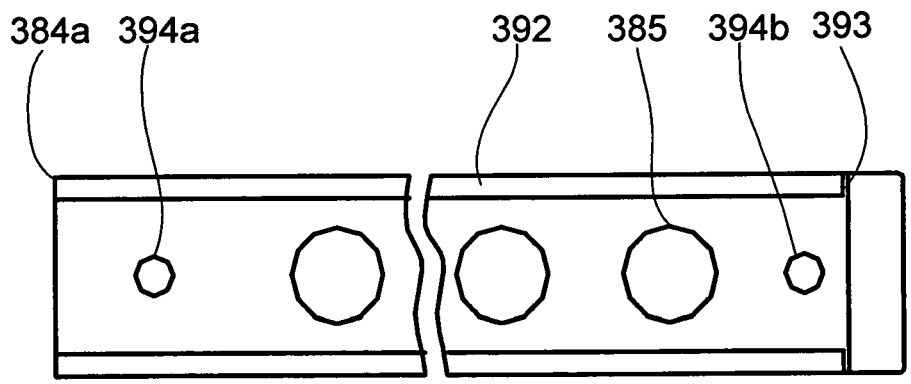
FIG. 6l is a view of the platform of the neck-capturing mechanism.

A neck-locking mechanism 317 of the clamping device 312 shown in FIG. 6f secures alignment of the containers 303 after removal of the aligning fingers 374 from the necks 338 of the containers. Capturing and locking necks 338 are provided with an array 380 of orifices 381 having variable apertures (FIG. 6g). The number of these apertures is equal to the number of the containers 303 in the array 302. These apertures can be large enough to capture the necks 338 of the containers 303 randomly distributed on the belt 313, 314 of the conveyer 315, 314. After alignment, the apertures of these orifices 381 can be narrowed to the size of the necks 338 in order to lock these necks by the clamping device 312 during delivery of the containers 303 to the vacuum chamber 304 for coating. Such a reduced aperture holds the containers 303 during deposition of the barrier layers as well as during return of the treated containers to the nested belt 316 of the conveyer 314. The same apertures of the orifices 381 can be enlarged in order to unlock the necks 338 after completion of handling the containers 303 in the nests 316 of the belt 314. The array 380 of the variable orifices 381 is formed by superposing holes 382 (FIG. 6f) of two top and bottom sliding strips 383a (FIG. 6h) and 383b (FIG. 6k), respectively, which move in opposite directions and are sandwiched between the top and bottom platforms 384a and 384b (FIG. 6l). Each platform has an array of large holes 385 (FIG. 6l). However, the geometry of holes 382 and 385 is different. While the holes 385 are round, the holes 382 are oval, with large and small radiuses of curvature. Superposition of the curvilinear parts 386 of the holes 382 with a large curvature form large orifices for embracing the necks 338 of the containers 303 with rough distributions on the belt 314 (FIG. 6g). Superposition of the narrowing edges 387 of the oval holes 382 forms small orifices capable of squeezing the necks 338 of the containers 303 in order to keep them in the locked condition and in strict alignment with respect to the processing stations. The above-described array 380 of the variable orifices 381 is achieved due to mutual reciprocal movement of the sliding strips 383a and 383b, one above the other and in opposite directions.

In order to provide such movement, the neck-locking mechanism 317 is provided with pairs of cams 388a and 388b and springs 389a and 389b, wherein each pair exerts pressure on the sliding strip 383a or 383b to urge them in mutually opposite directions (FIG. 6f). Each sliding strip is provided with a rectangular opening 390 and a semicircular cutoff 391 arranged on mutually opposite ends of the strip (FIG. 6h, k). Each platform 384a and 384b is provided with guides 392 for sliding strips 383a and 383b and slots 393 for jamming the ends of the semicircular springs 389 (FIG. 6l). Top and bottom platforms 384a and 384b are also provided at both ends with two bearing holes 394a and 394b (for the top platform 384a) and two bearing holes 395a and 395b (for the bottom platform) 384b (FIG. 6f). The guides 392 restrain reciprocating movements of the sliding strips 383a and 383b in the respective platforms 384a and 384b (FIG. 6l). The jamming slots 393 constrain the semicircular spring 389 which is squeezed or expanded in the semicircular cutoff 391. The bearing hole 394a of the top platform 384a and the bearing hole 395a of the bottom platform 384b are pierced by the arm 318a of the clamping device 312 (FIG. 6f). Respective holes 394b and 395b are pierced by the arm 318b. Both arms 318a and 318b driven by linear actuators 319a and 319b simultaneously support and move the neck-locking mechanism 317. They also rotate the cams 388a and 388b secured on these arms and situated inside the rectangular openings 390 in the top and bottom sliding strips 383a and 383b, respectively, which are sandwiched between the top and bottom platforms 384a and 384b.

Figure 6M:
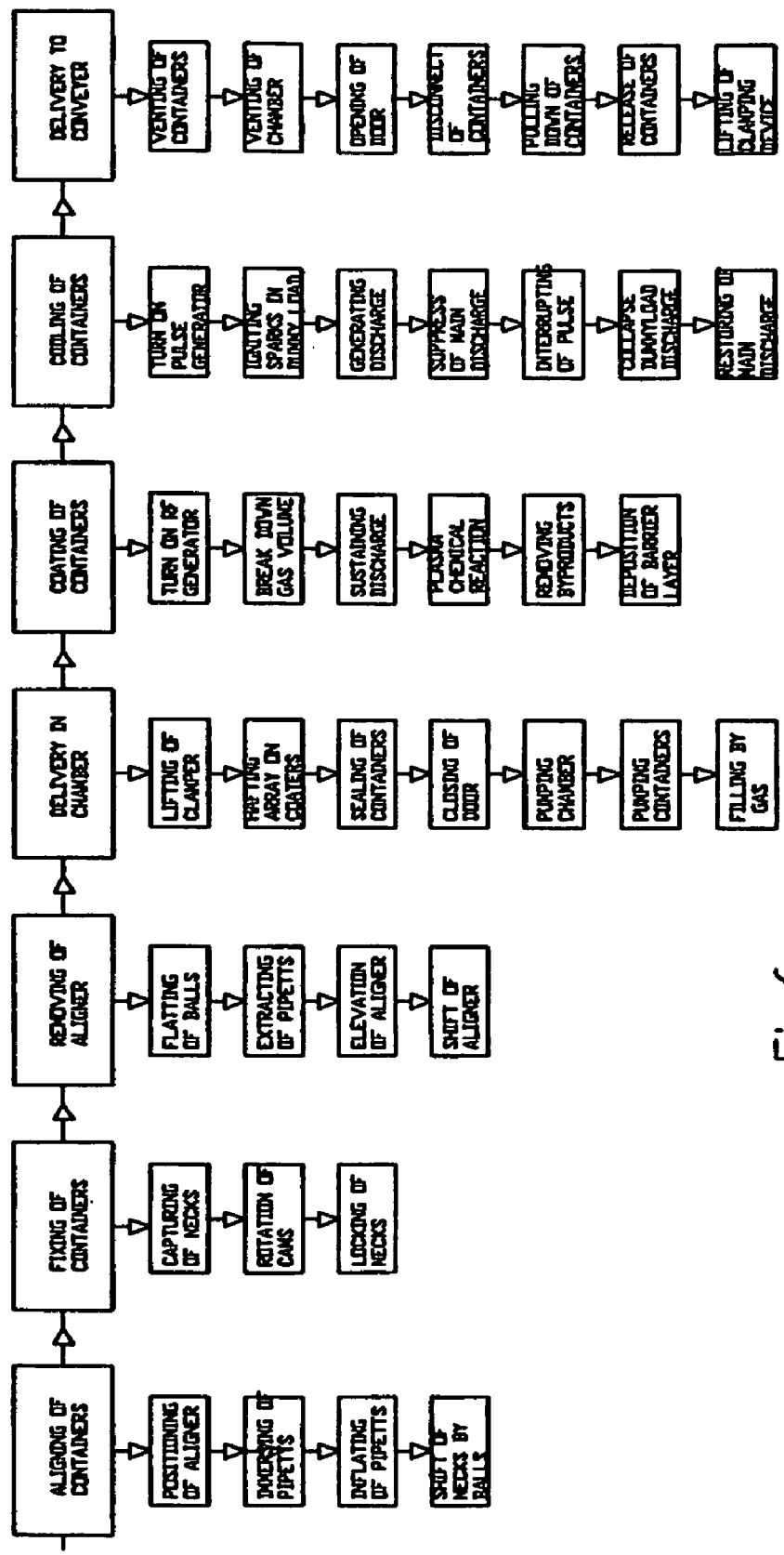
FIG. 6m is a view illustrating the sequence of operations for the formation of a barrier coating.

The cams 388a and 388b rotated by the arms 318a and 318b inside the rectangular openings 390 of the respective slides 383a and 383b push these slides against the semicircular springs 389a and 389b which are jammed in the slots 393 of the top and bottom platform 384a and 384b. Rotation of the cams 388a and 388b by the arms 318a and 318b is controlled by the step motors 397a and 397b which are connected to the opposite ends of these arms. The sequence of operation is illustrated in FIG. 6m. Operation of the apparatus will now be described with reference to the various mechanisms.

1. Capturing the Containers

The goal of this operation is to organize the plurality of the containers 303 roughly distributed on the belt 313 of the conveyer 314 into the array 302 of prealigned containers 303. This function is accomplished by means of the clamping device 312 (FIG. 6c). The linear actuators 319a and 319b move the arms 318a and 318b with the neck-locking mechanism 317 fixed to their ends from the vacuum chamber 304 toward the containers 303 which are distributed on the belt 314 of the conveyer 315 for casting the mechanism 317 onto the necks 338 of the containers 303. In order to pass the necks 338 through the holes of the neck-locking mechanism 317, the variable orifices 381 of the array 380 must be enlarged. Before casting, the step motors 397a and 397b rotate respective arms 318a and 318b in the opposite direction (FIG. 6f). The cams 388a and 388b are hafted on these arms, turn in clockwise and counterclockwise directions in the rectangular openings 391 of the sliding strips 383a and 383b, and are fixed in the transversal position relative to the strips (FIG. 6h, k). In such a position, the cams 388a and 388b do not push the strips against the semicircular springs 389a and 389b, and the springs shift the strips in the direction away from the central part of strip toward to the ends. The spring-loaded sliding strips shift with an offset that provides superposition of the curvilinear parts 386 with a large curvature of the oval holes 382 in the sliding strips 383a and 383b to form orifices large enough for penetration by the necks 338 (FIG. 6g). The necks 338 of the containers 303 pass through the sequence of the holes 385 of the bottom platform 384a and enlarged orifices 381 of two sliding strips and holes 385 of the top platform 384b. Although the necks 338 are captured by the neck-capturing mechanism 317, they are neither coaxial to the holes 385 of the top platform 384a nor to the holes 385 of the bottom platform 384a.

2. Aligning the Containers on the Belt

Figure 6P:
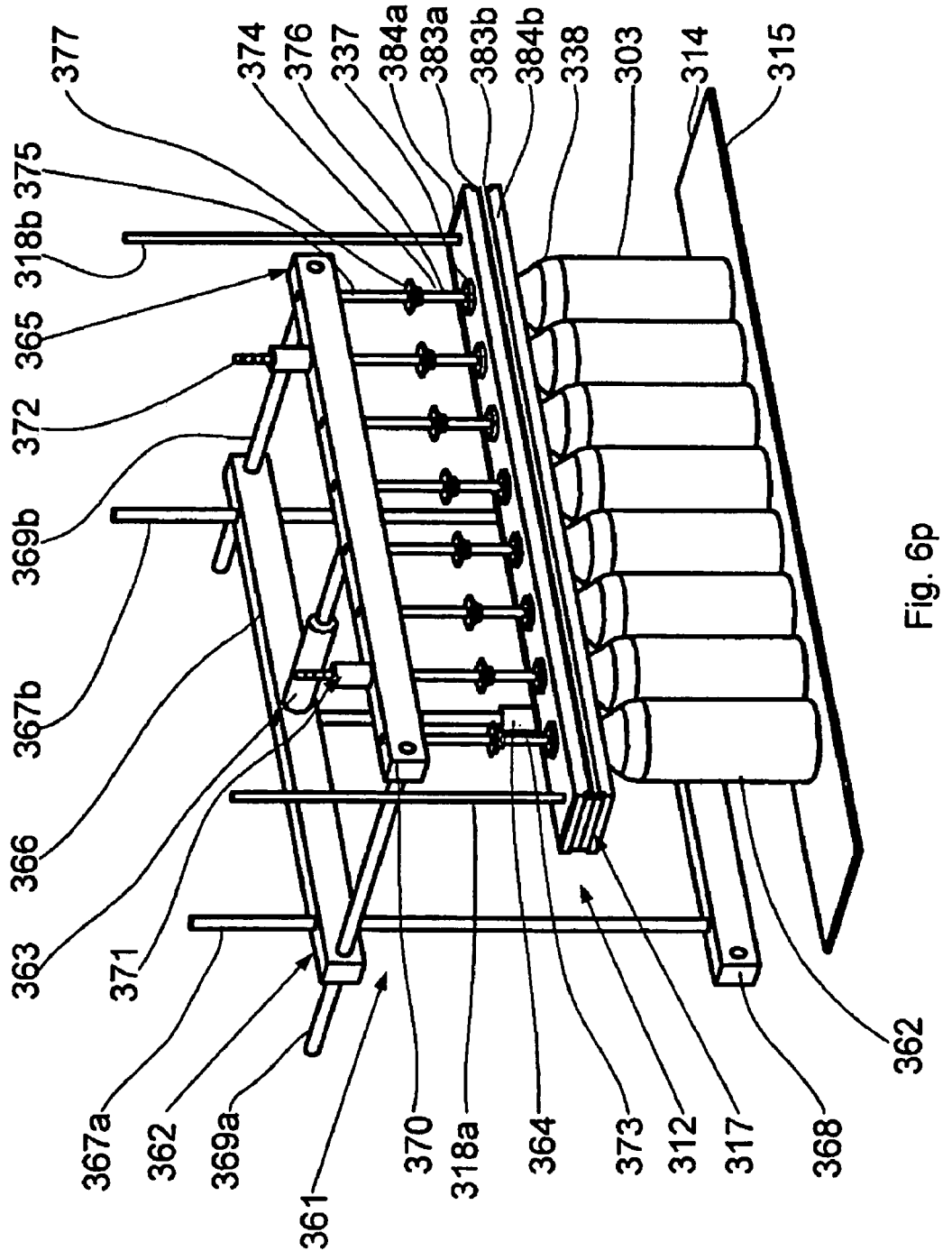
FIG. 6p is a view illustrating the alignment process carried out by means of an array of expandable fingers.
Figure 6Q:
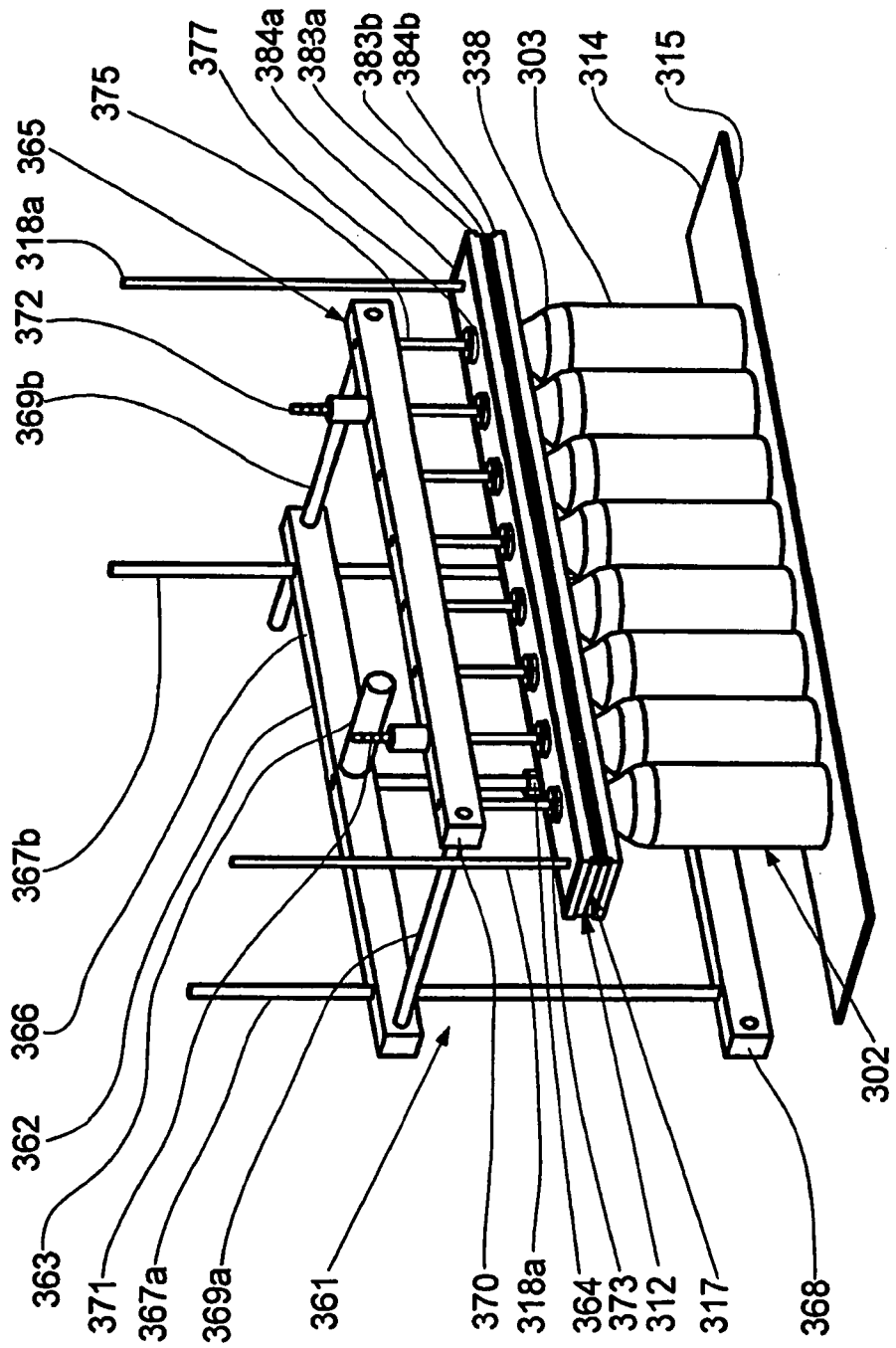
FIG. 6q is a view illustrating immersion of the array of the expandable fingers into the necks of the containers.

The goal of this operation is precise alignment of the containers 303 and organization thereof into the array 302 in order to match the array 306 of the coating stations 307 and the nozzles of the filling machine (not shown). The horizontal linear actuator 363 of the aligning device 361 allows positioning of the aligning station 365 with respect to the array of holes 385 of the top platform 384b of the neck-locking mechanism 317 that has already captured the necks 338 of the containers 303 (FIG. 6p). As a result, the array 373 of the fingers 374 is positioned above the necks 338 of the containers 303. The vertical linear actuator 364 pulls down the aligning station 365 with the air manifold 370 so that pipettes 376 enter the holes of the mechanism 317 (FIG. 6q) and immerse into the throats 378 of the necks 338 of the containers 303 positioned on the belt 314. The fingers 374, which are positioned coaxially to the aforementioned holes, move down through the necks 338 of the containers 303 to contact the rubber hut 377 with the lips 337. The compressor 371 supplies compressed air through the manifold 370 to the pipettes 376 immersed in the throats 378, whereby the pipettes are inflated and assume the shape of balls 379 (FIG. 6e). The balls 379 which are expanded in the throat 378 act as self-aligning universal joints that shift the necks 338 of the containers 303 from the random position to the position coaxial to the axis of the finger 374 against the respective holes of the neck-locking mechanism 317. The balls 379 that fill the space 378 inside the necks 338 organize the containers 303 in the array 302 in accordance with positions of the fingers 374 in the array 373. Parallel shift of the containers 303 by the expanded balls 379 is possible if the rubber huts 377 restrain movement of the necks 338 in the vertical direction. The flexible rubber huts 377 cover the lips 337 of the necks 338 and lightly press the containers 303 against the surface 313 of the belt 314 of the conveyer 315. The above operation provides strict alignment of the containers in the array 302 (FIG. 6q) with respect to the array 306 of the coating stations 307 (FIG. 6c).

3. Fixing the Containers in the Aligned Position

The goal of this operation is to secure the array 302 of the containers 303 in properly aligned positions relative to the respective coating stations 307 (FIG. 6c). Since the array 302 of the containers 303 is already captured by the neck-locking mechanism 317 and aligned by the balls 379, latching of the necks 338 is achieved by using the aforementioned orifices 381 of variable geometry. The step motors 397a and 397b turn the arms 318a and 318b and the respective cams 388a and 388b, thus rotating these cams simultaneously in the clockwise and counterclockwise directions, respectively (FIG. 6f).

Turning the cams 388a and 388b by 90 degrees (FIG. 6g) locks the necks 338 of the containers 303 of the array 302. Being positioned in the direction of two-dimensionality of the sliding strips 383a and 383b, the cams 388a and 388b push these sliding strips against the respective semicircular springs 389a and 389b, with the ends nipped in the slots 393 of the platforms. These springs 389a and 389b are squeezed uniformly due to the surface of the semicircular cut-offs 391a and 391b at the end of each sliding strip 383a and 383b. Each neck 338 of each container 303 can be latched into the grip organized by the opposite narrowing edges 387 of the oval holes 382 of the top and bottom sliding strips 383a and 383b (FIG. 6h,k). The pairs of cams 388a and springs 389a as well as of cams 388b and springs 389b develop mutually opposite forces that hold the necks 338 of the containers 303 in the array 302 at precise intervals (FIG. 6g).

4. Removing the Aligning Device

After alignment, the aligning device 361 becomes an obstacle on the way to the coating process. The goal of this operation is to clean the space for delivery of the clamping device 312 with the array 302 of the containers 303 which are locked in the aligned position by the neck-locking mechanism 317 for coating the inner walls of these containers with the barrier layer of silicon dioxide.

After accomplishing its functions, the aligning device 361 should be removed. In order to remove the aligning device, the array 373 of the fingers 374 is extracted from the necks 338 of the containers 303, and the aligning station 365 is shifted to provide room for movement of the clamping device 312 (FIG. 6p).

The vent 372 is turned on in order to drain the compressed air from the manifold 370 and balls 379. This deflates the fingers 374 back to the form of the pipettes 376 (FIG. 6e). The vertical linear actuator 364 elevates the slide 366 with the attached horizontal linear actuator 363 and the aligning station 365, thus extracting the pipettes 376 from the necks 338. The horizontal linear actuator 363 shifts the aligning station 365 from the pass of the clamping device 312 (FIG. 6p).

5. Assembling the Array of PECVD Chambers

Figure 6R:
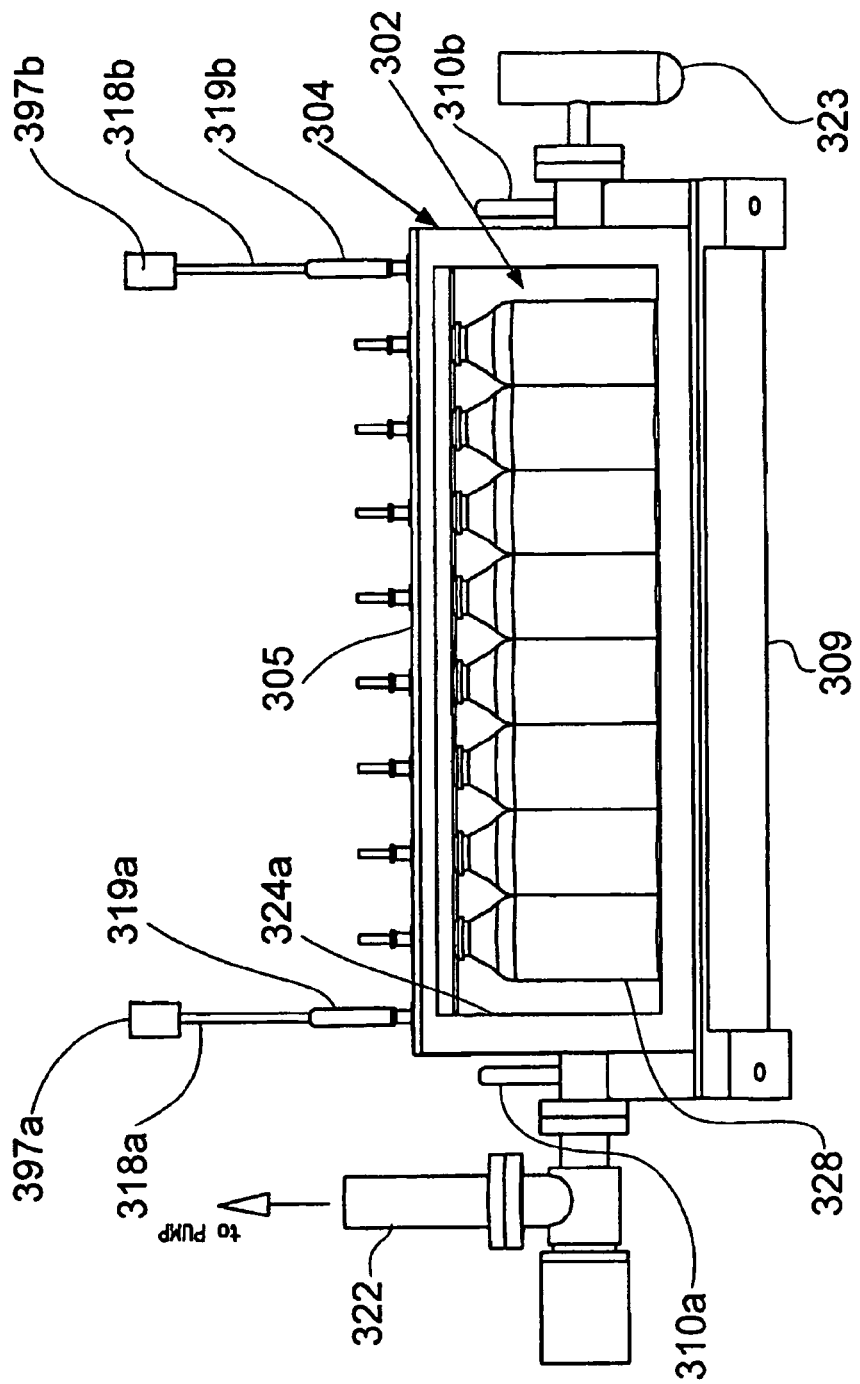
FIG. 6r is a view illustrating the sealed chamber with the containers halted on the coating stations.

The goal of this operation is rapid assembling of the array of individual PECVD process chambers 328 in the vacuum chamber 304, where each process chamber is comprised of a container 303, a transversal antenna 325 immersed in this container, an antenna holder 326, and a gas supply tube 327 (FIG. 6a). In other words, the process chamber is formed from the coating station when a container is inserted into this station. The difference between the process chambers and the coating stations is that the process chambers include containers 303a through 303n. It is understood that these chambers 328 are supposed to be reliably sealed and evacuated before filling with process gas. A sealed vacuum chamber 304 with the PECVD process chambers 328 is shown in FIGS. 6a and 6r.

Air must be evacuated from the vacuum chamber 304 through the valve 322, and in order to avoid parasitic discharges inside this chamber 304, pressure in the chamber 304, which is controlled by the Baratron 323, must be much lower than inside the individual PECVD chamber 328. Another reason for such evacuation is to prevent collapse of the containers 303 if the pressure in the vacuum chamber 304 exceeds the pressure inside the separated PECVD chambers.

Prior to sealing of the containers, the arms 318a and 318b with the clamping device 312 carrying the array 302 of the containers 303 is pulled up by the linear actuators 319a and 319b into the vacuum chamber 304 with the open door 309 (FIG. 6c). The clamping device 312 continues movement inside the chamber and hafts the containers 303 onto the antennas holders 326 of the coating stations 307 to contact the lips 337 of the necks 338 of the containers 303 with the surface 336 of the antenna holder 316 in order to form an array of sealed individual PECVD chambers 328 (FIG. 6a).

Such double evacuation of air prior to the coating operation is carried out as follows:

(a) movement of the clamping device 312 brings the lips 337 of the necks 338 of the containers 303 into contact with the surface 336 of the antenna holder 326;

(b) the door 309 of the vacuum chamber 304 is closed by the arms 310a and 310b driven by the linear actuators 311a and 311b;

(c) after closing the door 309, air is evacuated from the vacuum chamber 304 by the pump 321 through the valve 322; and (d) air is evacuated also from the inner volume 337 of the array of separated PECVD chambers 328 by the pump 350 through the oblique holes 353 of the antenna holder 326 and the manifold 352.

6. Coating Containers with Silicon Dioxide Barrier Layers

The goal of this operation is to deposit silicon dioxide layers having a thickness in the range of 9 to 10 nm onto the inner surfaces of the barrier layers of the container by using an ICP discharge. In order to provide high throughput, coating time must be within 3 to 4 sec.

An important component of this process is the transversal RF antenna 325, of the type described above with reference to FIGS. 1 to 5, which is immersed into the containers 303 for generating an ICP plasma discharge inside the containers in the vicinity of their inner walls (FIG. 6d). The plasma should have density up to $10^{-13}$ 1/cm$^3$ and uniformity up to 90%. Plasma having the above-mentioned characteristics decomposes TEOS into a siloxane backbone (Si—O—Si), decomposes oxygen into atomic oxygen, and provides a high rate of deposition of silicon dioxide (up to 2 nm/sec) with the formation of a barrier layer of high quality. A high temperature of plasma facilitates decomposition of oxygen into atomic oxygen. Lack of atomic oxygen leads to formation of microparticles of $SiO_2$ that can precipitate onto the inner walls of the containers. Also, it is understandable that at such temperature, the plastic material of the containers, especially biodegradable plastic, will melt unless special means are taken for cooling.

Each antenna 325 with a gas feeding tube 327 is immersed into a sealed volume 335, 337 inside the container 303 that is converted in the individual PECVD chamber 328, which is filled with a mixture of organosilane and oxygen. This mixture, which is delivered to the chamber 328 through the non-uniformly distributed holes 334 of the gas feeding tube 327, is prepared in the mixer 344 where the organosilane (TEOS) is delivered from the vaporizer 345 in the form of vapor (FIG. 6a). Oxygen is delivered to the same mixer from the oxygen tank 347 through the oxygen flow controller 348. The mixer 344 is communicated with the gas manifold 341 that distributes the mixture uniformly among the gas feeding tubes 327a and 327b and accordingly sends the mixture to individual PECVD chambers 328a through 328n. Partial oxygen pressure, which plays a crucial role in the plasma chemical reaction of TEOS, is tuned by the flow controller 348.

Indirect control of pressure in individual PECVD chambers is carried out by setting the Baratron 323 by activating the flow controller 348 and vaporizer 345 and filling each volume of the chamber 328 with precursor gas. Depending on the size of the container 303, the pressure is set in the range of 2 to 3 Torr to activate the RF generator 331. The rate of deposition depends on plasma density and may drastically improve throughput of the barrier-coating process. Throughput also depends on RF power and pressure of process gas in the containers, as well as on other factors, e.g., fill rate-of the container 303 with the precursor without leakage. In order to prevent deposition of organics on the inner surface of the container, byproducts of the plasma chemical reaction, such as water vapor and $CO_2$, must be rapidly removed from the container. RF power and gas pressure must be optimized to find a tradeoff between throughput and quality of the deposited barrier layer.

The RF discharge 349 (FIG. 6d) in each container 303 filled with process gas is generated by the respective transversal antenna 325. The transversal antenna 325 is immersed in this container by energizing RF power from the RF generator 331 connected to the antenna terminals 332 and 333 through the matching network 330. The matching network 330 is tuned to resonance and develops high RF current on the coils of the antenna 325. RF current that circulates through the antenna coils generates several magnetic fields according to the number of coils arranged with uniform angular intervals around the axis of the container. These magnetic fields propagate with vectors paraxial to the planes of symmetry of the rectangular or elliptical coils. The magnetic fields, which are uniformly distributed and directed to the inner wall of the container 303, are converted into strong electrical fields that accelerate the charged particles, break down the gas volume, especially if argon is added to the gas mixture, and generate high-density plasma that is uniformly distributed in the vicinity of the inner wall of the container 303. Heat from the plasma generated by the ICP discharge 349 decomposes organosilane, especially TEOS vapor, and breaks off methyl groups of organosiloxane. The discharge also generates atomic oxygen and initiates a plasma chemical reaction. This oxygen oxidizes methyl groups and any other organic groups. Further, oxygen oxidizes the condensable siloxane backbone (Si—O—Si) resulting from TEOS decomposition and forms a barrier layer 328 of silicon oxide ($SiO_x$) on the interior surface 329 of container 303. Byproducts of plasma chemical reactions, such as $CO_2$ and water, are removed by the pump 350 through the oblique holes 353 of the antenna holder 326 and the manifold 352.

Under some conditions of the RF discharge 349, the deposited silicon dioxide layer 328 formed on the inner wall surface 329 of the container 303 may have a desired transparency, impermeability to fluids, and strength of adhesion to the plastic walls. Quality of the coating depends on the chemistry of the barrier layer of $SiO_x$, where X can be optimized in the range of 2.3 to 2.7, depending on dilution of organosilane by oxygen.

7. Cooling the Inner Walls of the Containers

The goal of this operation is preserving the shape of the containers 303 and protecting the structure of the plastic from degradation during the PECVD process in each PECVD chamber 328, wherein the wall of the container is exposed to high thermal flux irradiated by plasma (FIG. 6d).

Decomposition of biodegradable plastic material under the effect of thermal shock can be prevented if the shock is short enough and if it alternates with periods of cooling when the discharge is interrupted and the flow of cold process gas cools the inner walls. The threshold of degradation of the plastic material of the container will not be exceeded and throughput will not be reduced if the periods of hot plasma generation are shunted and alternated with periods wherein plasma is sustained in a passive glow state and at a low level of power consumption.

The working cycle of the each coating station 307 consists of a coating period and a noncoating period. The interruption of RF discharge 349 of high energy consumption during the noncoating period in the coating station is achieved by using dummy loads 355a and 355b, which consume a valuable part of this power from the transversal antenna, which is necessary for providing the plasma chemical reaction. The dummy loads simultaneously shunt and suppress the discharges in all containers 303 during the noncoating period when the PECVD process is interrupted.

The windows 324a and 324b serve for inductive communication between the antennas 325 and the dummy loads 355a and 355b, which absorb a valuable part of the RF power from the transversal antennas 325 so that the RF discharges 349 in the containers 303 do not extinguish but merely diminish to a weak glow discharge level, wherein process gas is not converted into hot plasma. During these cooling intervals, the process gas cools the inner walls of the containers 303 and is pumped out without decomposition. The electromagnetic fields from the antennas 325 are strong enough to penetrate the windows 324a and 324b and generate strong electric fields in the volumes of the dummy loads positioned next to the windows. However, argon pressure inside the dummy loads is high enough and the electric field in the vicinity of the dummy load is low enough for breakdown in the argon volume and for generation of the initial charged particles needed for plasma discharge. In order to generate the particles crucial for generation of the plasma discharge, the dummy loads 355a and 355b are provided with an igniting electrode 357 connected to the pulse generator 358. A spark from the pin of the igniter 357 charges a certain number of particles during the high-voltage pulse 359 generated by the pulse generator 358.

These charged particles injected in the volume of the dummy loads pierced by the magnetic field propagated from the antenna facilitate an electric field that is strong enough for breakdown. RF discharges generated in these dummy loads 325a and 355b consume a valuable amount of RF power from the antenna through the propagated magnetic field. In other words, the gas discharges in the dummy loads 325a and 355b absorb RF power from the RF generator 331 to sustain plasma in the dummy loads 355a and 355b during noncoating periods used for cooling the containers 303 with cold process gas in the coating stations. Although during noncoating periods the RF generator 331 is working under the same operating conditions, heating of the walls of the containers 303 is avoided due to provision of the aforementioned dummy loads.

Thus, the RF discharges 361 of the dummy loads are designed to provide cooling intervals inside the containers 303. By absorbing a valuable part of RF power, the dummy loads interrupt heating of the inner walls of the containers 303 by plasma and allow cooling of biodegradable plastic by process gas.

Because of a low potential of ionization, argon is used in dummy loads as a discharge gas because it is more pliable to triggering and consuming RF power than is the TEOS-oxygen mixture in the container 303 with a high potential of oxygen ionization. The plasma of the argon discharge 361 in the dummy loads 355a and 355b permeated by the magnetic field from the antenna efficiently absorbs RF power from the antenna. In order to sustain the plasma, the discharge 349 in the TEOS-oxygen mixture needs to consume a predetermined RF power that is higher as compared with RF power needed to sustain plasma in argon. In addition, the discharge in the TEOS-oxygen mixture weakens much faster than in argon. In other words, the apparatus and method of the invention make it possible to reduce energy in the PECVD chamber to the level at which plasma density is below the threshold of the plasma chemical reaction but above the threshold at which plasma disappears. This period of the cycle, during which energy transfers to the dummy loads, can be used to cool the plastic containers of the coating stations with cold process gas.

Argon pressure in the dummy load is adjusted to a level high enough to interrupt the discharge 361 between the ignition pulses 359 during intervals 360 when charged particles are supposed to be absent. When the discharges 361 inside the dummy loads collapse, all RF power is applied to sustain the RF discharges 349 inside the containers 303 in order to continue deposition of the $SiO_2$ barrier layer 329 onto the cold inner wall of the container 303.

The generator 358 that generates a sequence of high-voltage pulses 359 and initiates the plasma discharges 361a and 361b divides power between the discharges 361a and 361b and the discharge 349 in the container 303. During depletion of the discharge 349, a cold precursor, which is still injected into the container 303 by the gas tube 327, cools the inner surface of the container. For self-sustaining, each RF discharge 349 inside the container 303 having the size of a Coca Cola bottle requires just 100 W of RF power at the pressure level of process gas equal to 2 Torr and at a frequency of 60 MHz. Thus, the discharge 349, which is depleted during consumption of RF power by the discharge shunting system 354, can be immediately restored during the intervals 360 between the high voltage pulses 359. During these intervals, the igniter 357 does not produce sparks to generate charged particles. Although the stray magnetic field still penetrates the dummy load, it is weak enough in argon to generate an electric field that is capable of causing a breakdown of the dummy loads. Since consumption of RF power by the dummy loads 355a and 355b is interrupted, ICP discharges inside the containers 303 can start immediately, taking into account the presence of the charged particles generated by the glow discharge remaining in the containers during the cooling period. Thus, the PECVD process inside the containers 303 continues with reduced thermal shock on the inner walls. The duration of the pulses generated by the pulse generator 358 and applied to the igniter 357 can be optimized to simultaneously maintain the wall of the container 303 at a temperature lower then the degradation threshold and to maintain a high rate of deposition.

8. Delivery of Array of Containers to Conveyer

The goal of this operation is to place the array 302 of the coated containers 303 on the nested part 316 of belt 314 of the conveyer 315 and to release the containers from the clamping device 312 in the cartridge belt with secured intervals between the containers (FIG. 6b and FIG. 6c).

After completion of the coating process, the volume of the containers 303 and the vacuum chamber 304 are vented. The linear actuators 311a and 311b drive the door 309 out of the chamber 304, opening the way for extraction of the array 302 of the coated containers 303. The linear actuators 319a and 319b move the clamping device 312, thus disconnecting the lips 337 of the necks 338 from the antenna holder 326. Following this, the actuators return the array 302 of coated containers 303 which are locked by the orifices 381 to the nested part 316 of the belt 314 of the conveyer 315. The linear actuators 319a and 319b also provide a soft touch to the bottoms of the containers 303 with the nests 316.

After the containers are placed in the nests of the belt, the step motor 397a performs a 90-degree clockwise turn, and the step motor 397b rotates the linear actuators 319a and 319b, respectively, by 90 degrees in the counterclockwise direction (FIG. 6c and FIG. 6f). Rotation of the cams 388a and 388b connected to these arms in the transversal direction relative to the strips 383a and 383b terminates pressure of the cam on the sliding strips 383a and 383b. Being squeezed by the cams and released from their pressure, the semicircular springs 389a and 389b push apart the sliding strips 383a and 383 (FIG. 6g). This movement enlarges the variable orifices 381 and unlocks the necks 338 of the containers 303, which are latched by the narrowing edges 387 of the holes 382 in the strips.

The clamping device 312 is lifted by the arms 318a and 318b which are driven by the linear actuators 319a and 319b, leaving the array 302 of the containers 303 on the nested part 316 of the belt 314. Then the conveyer 315 delivers the coated containers 303 in the array order with the interval between the containers equal to the interval in the array of the filling machine nozzles (not shown).

The conveyer 315 delivers a new plurality of containers 303 positioned randomly on the flat part 313 of the belt 314 for coating, and the linear actuators 319a and 319b drive the arms 318a and 318b with the clamping device 312 back to the belt 314, 313 in order to organize a new array 302 of the containers 303 and to deliver them to the chamber 304 (FIG. 6c).

The ICP discharge simultaneously with coating of the containers sterilizes the inner walls of the containers. Thus, alignment of the containers is not required before exposing them to the filling machine array of nozzles.

The invention also allows for a double-coating process of the containers wherein the transversal antenna generates the inner RF discharge simultaneously with the outer RF discharge in the outer volume of the vacuum chamber 304, which is filled with another organometallic precursor. The outer PECVD process sharing the same antenna allows application of coatings onto the outer surfaces of the containers simultaneously with application of barrier layers onto the inner walls of the same containers.

For example, the outer UV mirror coating capable of reflecting UV radiation can be applied onto the outer surfaces of the containers, especially wine bottles, simultaneously with the formation of silicon dioxide coatings on the inner surfaces of the bottles if volume of the vacuum chamber 304 outside the bottles is filled with titanium-containing gases such as titanium isopropoxide ($Ti(O-i-C_3H_7)_4$). Amorphous $TiO_2$ thin films can be deposited on the outer surfaces of containers by means of the plasma chemical reaction of titanium isopropoxide with oxygen.

Figure 7:
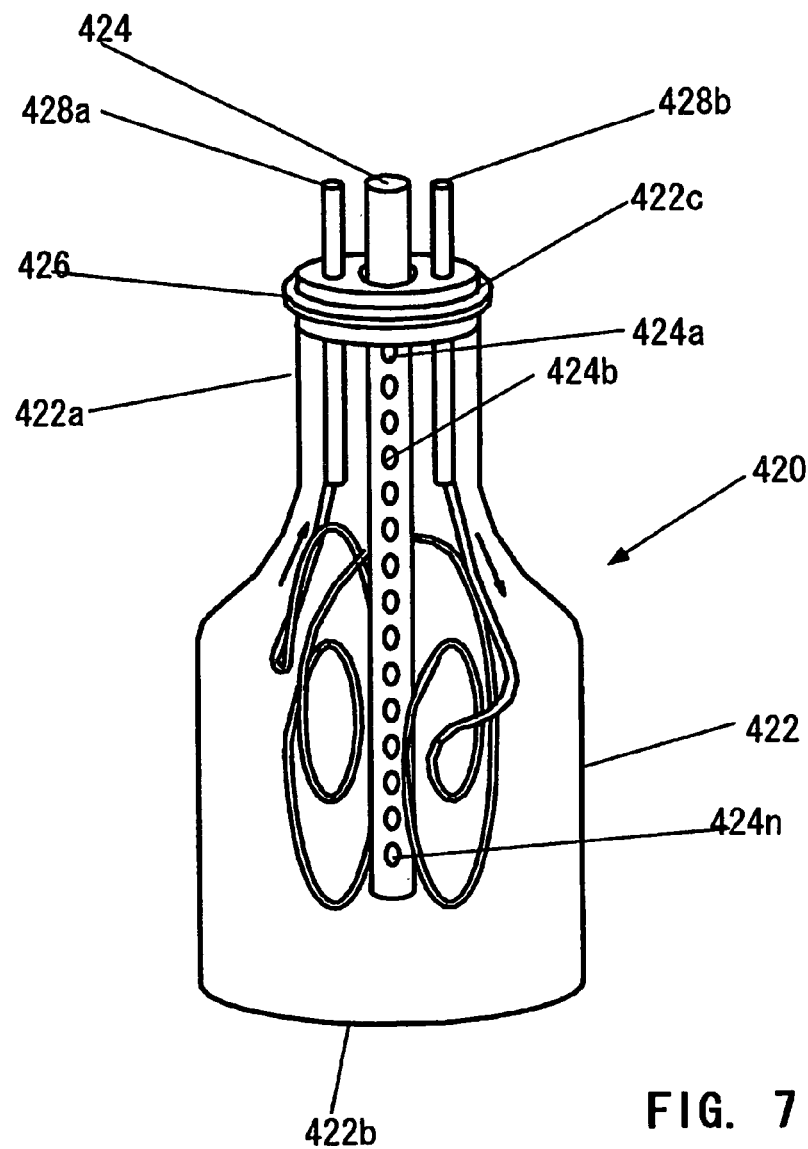
FIG. 7 is a three-dimensional view illustrating a three-dimensional saddle-shaped transversal RF antenna of the invention inside a container, e.g., a bottle into which the working gas is supplied through openings in the gas distribution tube.

Referring to coating of the hollow containers, it is desirable to provide uniform deposition of coating films onto the inner walls of the containers as well as onto the container bottoms. Because plasma cannot be uniform in each part of a container, the gas supply system may compensate for such nonuniformity by using gas-distribution means. For example, the three-dimensional view shown in FIG. 7 illustrates the saddle-shaped ICP transversal antenna assembly 420 of the invention inside the container, e.g., a bottle 422 and a gas supply tube 424 with a plurality of openings 424a through 424n through which process gas such as hexamethlydisiloxane (HMDSO) or TEOS in mixture with oxygen and argon is injected into the bottle 422. By varying the size of the openings in the longitudinal direction of the gas supply tube 424, the flow rate can be adjusted through individual openings and thus provide approximately 90% uniform deposition of the coating and uniform deposition thickness on the inner surface from the neck to the bottom of the container. The pitch between the openings may also vary along the gas supply tube in order to select the most optimal regimen of deposition in accordance with the specific geometry of the bottle. For example, the diameter of opening 424a may be smaller than the diameter of opening 424n. Density of openings in the bottom area can be higher than density of openings in the neck area.

Figure 8:
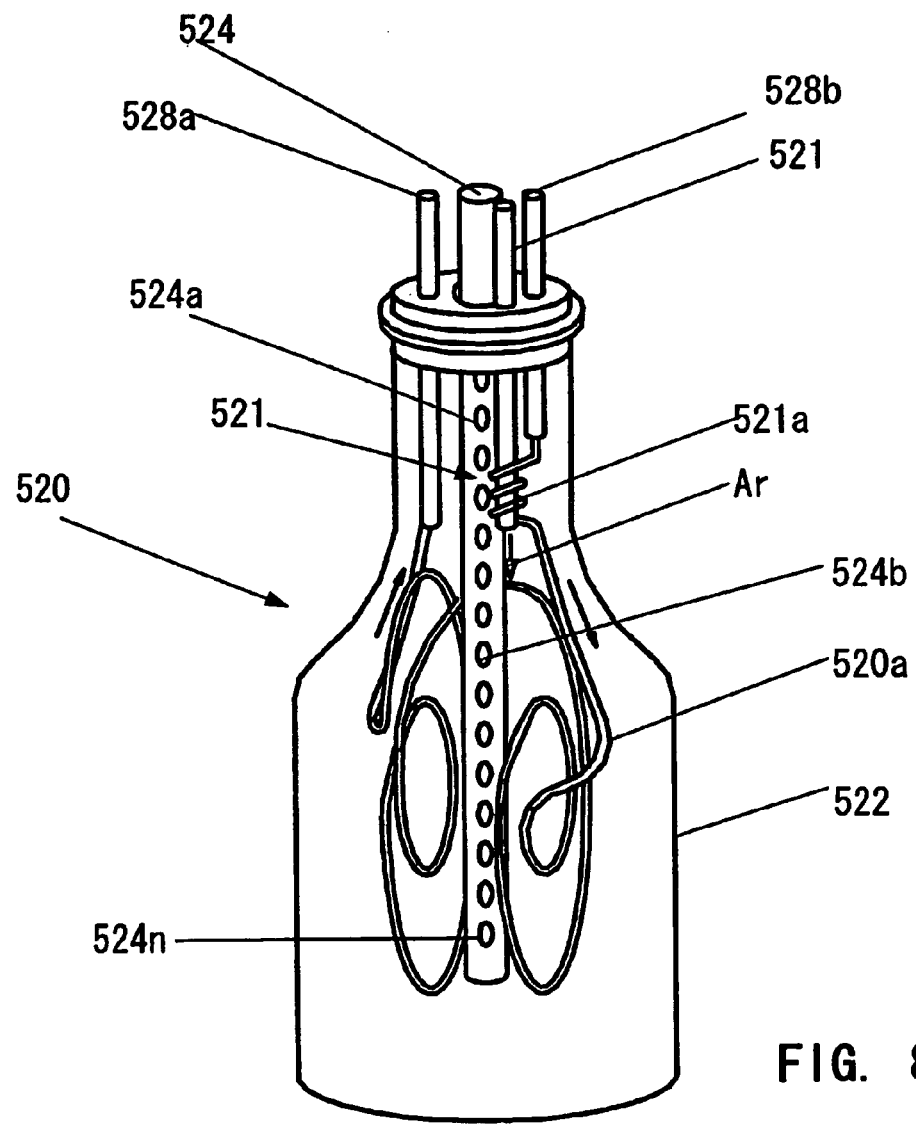
FIG. 8 is a view similar to FIG. 7, wherein the transversal antenna assembly is provided with a solenoid that together with an argon delivery tube constitutes a discharge plasma ignition trigger for initial ignition of plasma in the container, e.g., a bottle.

Reference numerals 428a and 428b designate terminals of the antenna winding. FIG. 8 is a view similar to FIG. 7 and illustrates a modification in which the antenna assembly 520 is additionally equipped with a plasma ignition-triggering device 521. Parts and elements of the device in FIG. 8, similar to respective parts and elements in FIG. 7, are designated by the same reference numerals as in FIG. 7 but with the addition of 100. For example, the container is designated by reference numeral 522, the antenna assembly is designated by reference numeral 520, the gas supply tube is designated by reference numeral 524, and so forth.

Further improvement can be made to the aforementioned method of coating the containers with the application of barrier layers by means of two discharges, one in the container and another in the dummy load, and with alternating interception of RF power between both discharges. However, in some situations the sequence of such alternating interception can be violated if the sequence is controlled merely by the pulse generator. More specifically, while discharge in the dummy load with low potential of ionization of argon can be triggered relatively fast, discharge in the container with organosilane and oxygen, both of which have a much higher potential of ionization, takes a longer time. After interruption of the discharge in the dummy load, the discharge in the container needs to be boosted in order to accelerate sustaining of plasma. According to the invention, such boosting can be achieved by injecting ions of argon, in addition to process gas, into the container through a separate tube. An additional device for performing this function should trigger the ICP discharge inside the container (FIG. 8). Such triggering device may comprise the following: (1) a solenoid 521a that is a branch of the antenna winding 520a joined to the RF generator through the matching device, and (2) a quartz or ceramic gas supply tube 521b joined to the reservoir of inert gas, such as argon, krypton, etc., (not shown) through a flow controller (not shown).

The antenna holder is provided with an additional opening to allow the tube 521b to pass through the holder and to be immersed in the container. A strong electromagnetic field of the aforementioned solenoid 521a (FIG. 9) develops a capillary discharge that generates ions of argon inside the tube 521b. Arrow Ar shows the direction of argon ions emitted from the tube 521b and used for initiating the main discharge in the mixture of organosilane and oxygen that is reluctant to sustain the discharges without additional assistance. Such triggering device reduces the time needed to sustain the plasma during a short RF power pulse assigned to maintain the biodegradable plastic at a low temperature.

Thus, it has been shown that the invention provides a method and apparatus for application of barrier coatings onto the inner surfaces of containers. The apparatus and method of the invention are suitable for application of silicone dioxide layers onto the inner surfaces of plastic containers at relatively low temperatures. Deposition is carried out at high speed and with the possibility of controlling the material deposition process so that the proposed technique becomes suitable for mass production with high throughput. The antenna has a three-dimensional shape tailored to the specific profile of the inner walls of the treated container and therefore provides uniform deposition of the coating material.

Although the invention is shown and described with reference to specific embodiments, it is understood that these embodiments should not be construed as limiting the areas of application of the invention and that any changes and modifications are possible, provided these changes and modifications do not depart from the scope of the attached patent claims. Due to a wide operation window of the transversal antenna, the different plasma densities can be achieved. A high plasma density mode can be achieved in the range of $10^{13}/cm^3$ at a frequency of 60 MHz, RF power from 100 to 150 W, and pressure from 2 to 3 Torr. A low plasma density mode in the range $n=10^{10}/cm^3$ can be achieved at an RF power of 30 to 50 W and at a pressure of 50 mT. Depending on plasma density, the precursor can be activated, reacted, and dissociated, as required. The extent of dissociation can be well controlled by adjusting RF power, pressure of the precursor, and degree of dilution with inert gas. Versatility of the transversal antenna and the width of the operation window provided by the ICP discharge, makes it possible to achieve, e.g., a hybrid coating inside containers that may consist of several layers, e.g., of organic and inorganic components. Such hybrid coating can be used to improve wear-resistant properties of coatings. The plasma chemical reaction inside the container may form barrier coatings with different properties by stacking organic and inorganic layers onto each other, which is achieved by combining different precursors and different conditions of the ICP discharge. Transversal antenna windings may have shapes different from those shown in the drawings, and the winding of the antenna may consist of five or more coils having different dimensions and configurations. The antenna is suitable for application of coatings onto inner surfaces of hollow containers made from different plastic and nonplastic materials and having cylindrical, spherical, semispherical, barrel-like, or other shapes. The transversal antenna may have an adjustable three-dimensional geometry for insertion into a container through a narrow opening in a folded state and with subsequent unfolding or expansion inside the container for shifting the windings closer to the inner walls.

The invention claimed is:

1. An apparatus for deposition of thin-film coatings from inductively coupled plasma onto the inner surfaces of containers by a PECVD process, the containers having throats with necks and the apparatus comprising the following:
   a sealable vacuum chamber with a door that periodically can be opened;
   a conveyor for transporting a plurality of preoriented containers into and from the vacuum chamber when the door is opened;
   an alignment mechanism comprising a plurality of expandable elements organized into an array that may have an expanded state and a nonexpanded state, the elements being insertable into the throats of the necks of containers in the nonexpanded state and which in the expanded state are capable of shifting the containers into an aligned position wherein the containers are spaced apart at equal distances;
   a fixation mechanism for fixing the containers in the aligned position;
   an expandable-element driving mechanism for inserting expandable elements into the throats of the necks of containers prior to expansion and for removing the expandable elements from the containers in a nonexpanded state after the containers are fixed by the fixation mechanism in the form of an array of equally spaced containers;
   a plurality of coating stations, each coating station comprising the following: an RF transversal antenna for generation of an inductively coupled plasma discharge in the container; an antenna holder with air evacuation holes; and a process gas supply tube inserted into the container, the transversal antennas of the coating station being capable of generating a transverse magnetic field, said coating stations forming an array of coating stations with distances between the adjacent antennas being equal to the distances between the aforementioned equally spaced containers in the aligned position;
   an RF generator connected to the plasma-generating transversal antenna of each coating station; and
   a mechanism for unloading the coated containers from the vacuum chamber for subsequent treatment in the form of the aforementioned array of equally spaced containers.

2. The apparatus of claim 1, further comprising at least one dummy load arranged in the vicinity of the array of coating stations, said dummy load having means for intercepting a part of the power from the transversal antenna, the coating stations having a working cycle consisting of a coating period and a noncoating period, said at least one dummy load having means for consuming a part of RF power, thus reducing the level of power from the plasma-sustaining level in the coating station to the charged-particle generating level for shunting and suppressing discharges in the containers during the noncoating period.

3. The apparatus of claim 2, further comprising a lifting mechanism for delivery of the array of equally spaced containers in the aligned state to the coating stations for contact with the antenna holders.

4. The apparatus of claim 2, wherein the containers have diameters, and wherein the fixation mechanism comprises a container locking mechanism having an array of variable apertures that are large enough to pass the necks of containers in the aforementioned aligned position and that are capable of narrowing to the size of the necks of the container in order to lock the necks of the containers for holding or transporting the containers altogether as an array for delivery of the array to the vacuum chamber or to subsequent operation outside the apparatus.

5. The apparatus of claim 4, wherein the process gas comprises a mixture of a gaseous organosilicon compound and oxygen.

6. The apparatus of claim 5, wherein gaseous organosilicon is gaseous siloxane and wherein the coatings applied from the plasma chemical reaction in the aforementioned mixture onto the inner surfaces of the containers are barrier layers of silicon dioxide.

7. The apparatus of claim 2, comprising two dummy loads arranged on opposite sides and in the vicinity of the array of coating stations, each dummy load being in magnetic interaction with the transversal antenna and comprising a sealed vessel filled with an inert gas and an igniter for generation of charged particles in said inert gas with the density of charged particles sufficient for generating gas discharge in said inert gas under the effect of a stray magnetic field generated by said transversal antennas in the coating stations, the level of stray RF power being sufficient for generating and sustaining the RF discharges in the dummy loads.

8. The apparatus of claim 7, wherein the process gas comprises a mixture of a gaseous organosilicon compound and oxygen.

9. The apparatus of claim 8, wherein gaseous organosilicon is gaseous siloxane and wherein the coatings applied from the plasma chemical reaction in the aforementioned mixture onto the inner surfaces of the containers are barrier layers of silicon dioxide.

10. The apparatus of claim 1, wherein the expandable elements are made from an inflatable material and may have an inflated state and a deflated state, in the deflated state the expandable elements having diameters smaller than the throats of the necks of the containers, while in the inflatable state the expendable elements having diameters greater than the diameters of the throats of the necks of the containers so that in the inflated state the expandable elements hold the containers and act as universal joints that self-align the containers into said aligned position, said alignment mechanism having means for restricting movement of the containers during alignment in the vertical direction and allowing movement thereof only in the horizontal direction when the containers are held by the expandable elements in their inflated state.

* * * * *